United States Patent
Feng et al.

(10) Patent No.: US 6,727,530 B1
(45) Date of Patent: Apr. 27, 2004

(54) INTEGRATED PHOTODETECTOR AND HETEROJUNCTION BIPOLAR TRANSISTORS

(75) Inventors: Milton Feng, Champaign, IL (US); Shyh-Chiang Shen, Champaign, IL (US)

(73) Assignee: Xindium Technologies, Inc., Champaign, IL (US)

( * ) Notice: Subject to any disclaimer, the term of this patent is extended or adjusted under 35 U.S.C. 154(b) by 0 days.

(21) Appl. No.: 10/379,862

(22) Filed: Mar. 4, 2003

(51) Int. Cl.$^7$ ................................................ H01L 29/72
(52) U.S. Cl. .................... 257/184; 257/26; 257/186; 257/187; 257/197; 257/198; 257/458
(58) Field of Search .................... 257/26, 184, 186, 257/187, 197, 198, 458

(56) References Cited

U.S. PATENT DOCUMENTS

| | | |
|---|---|---|
| 4,377,723 A | 3/1983 | Dalal |
| 5,342,453 A | 8/1994 | Olson |
| 5,448,080 A | 9/1995 | Han et al. |
| 5,453,135 A | 9/1995 | Nakagawa et al. |
| 5,557,117 A * | 9/1996 | Matsuoka et al. .......... 257/184 |
| 5,682,046 A | 10/1997 | Takahashi et al. |
| 5,684,308 A | 11/1997 | Lovejoy et al. |

(List continued on next page.)

OTHER PUBLICATIONS

D. Caruth et al., Abstract, A 40 Gb/s Integrated Differential PIN+TIA with DC Offset Control Using InP SHBT Technology, Xindium Technologies, Inc., et al., 3pp. presented Oct. 21, 2002.

P.A. Houston, "High Frequency Heterojunction Bipolar Transistor Devise Design and Technology", Electronics & Communication Engineering Journal, Oct. 2000, pp. 220–228.

Sawdai et al., Self–Aligned Technology For GaAs and InP–based Heterojunction Bipolar Transistors (HBTs), U.S. Army Research Office DAAL03–92–G–0109, NEC Inc. and Bell Northern Research, www.eecs.umich.edu/dp–group/research/selfalignedHBTS.html, 1999.

Alekseev, et al., "High–Isolation W–band InP based PIN Diode Monolithic Integrated Switches", 1997 IEEE/Cornell Conference on Advanced Concepts in High–Speed Semiconductor Devices and Circuits, Aug. 4–6, 1997.

Stephen A. Campbell, "The Science and Engineering of Microelectronic Fabrication (Second Edition)", Feb. 1, 2001, Chapter 18, pp. 465–480.

*Primary Examiner*—Edward Wojciechowicz
(74) *Attorney, Agent, or Firm*—McKenna Long & Aldridge LLP

(57) ABSTRACT

The speed at which optical networking devices operate is increased with the present invention with integrated circuits that provide both optical and electronic functions. The present invention provides highly integrated p-i-n or p-i-n-i-p photodetectors and heterojunction bipolar transistors for amplifying photodetector signals formed from a single semiconductor layer stack. The techniques are applicable for the integration of all InP-based and GaAs-based single-heterojunction bipolar transistors and double-heterojunction bipolar transistors. The photodetectors and transistors are formed from common layers, allowing them to be manufactured simultaneously during a processing of the stack. Integrating these components on a single circuit has the potential to greatly increase the speed (in excess of 40 Gb/s) and to decrease the cost of high-speed networking components through the development of compact optical circuits for optical networking. The present invention also includes the inclusion of a reflecting stack of semiconductor layers below the photodetector to increase the responsivity of the detector.

32 Claims, 23 Drawing Sheets

U.S. PATENT DOCUMENTS

| | | |
|---|---|---|
| 5,689,122 A | 11/1997 | Chandrasekhar |
| 5,978,401 A | 11/1999 | Morgan |
| 6,055,262 A | 4/2000 | Cox et al. |
| 6,107,151 A | 8/2000 | Enquist |
| 6,111,276 A | 8/2000 | Mauk |
| 6,242,794 B1 | 6/2001 | Enquist |
| 6,281,561 B1 | 8/2001 | Stiebig et al. |
| 6,300,557 B1 | 10/2001 | Wanlass |
| 6,300,650 B1 | 10/2001 | Sato |
| 6,323,480 B1 | 11/2001 | Tran et al. |
| 6,326,649 B1 | 12/2001 | Chang et al. |
| 6,429,463 B1 | 8/2002 | Mauk |

\* cited by examiner

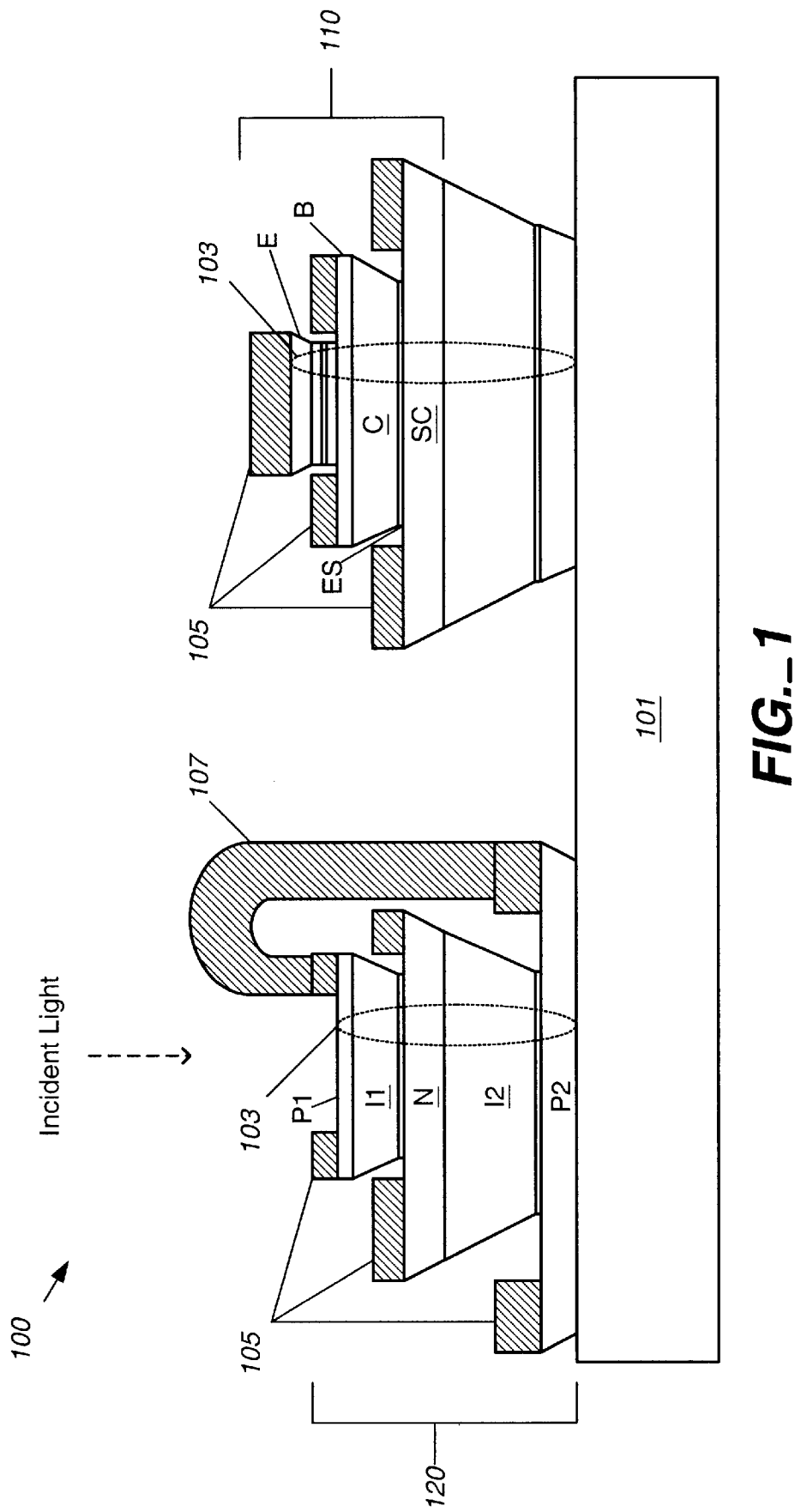
FIG._1

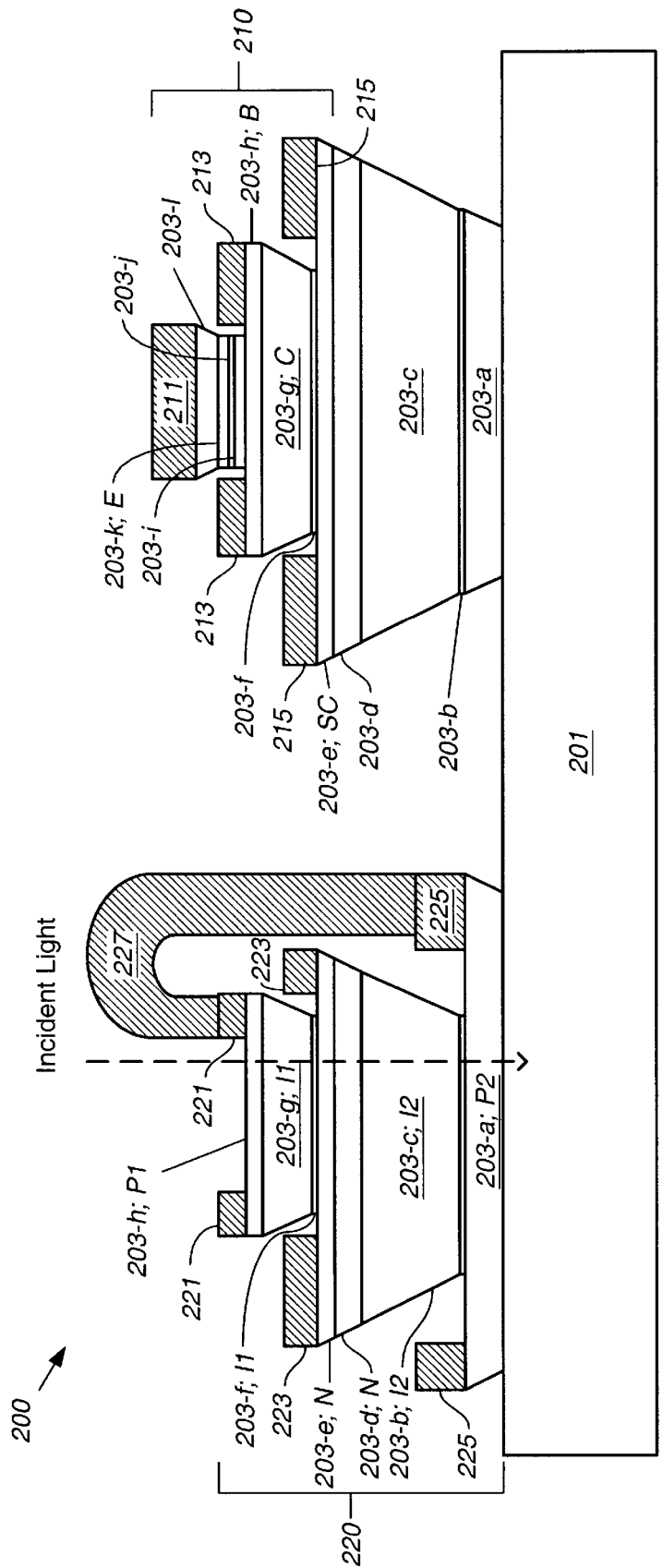
FIG._2

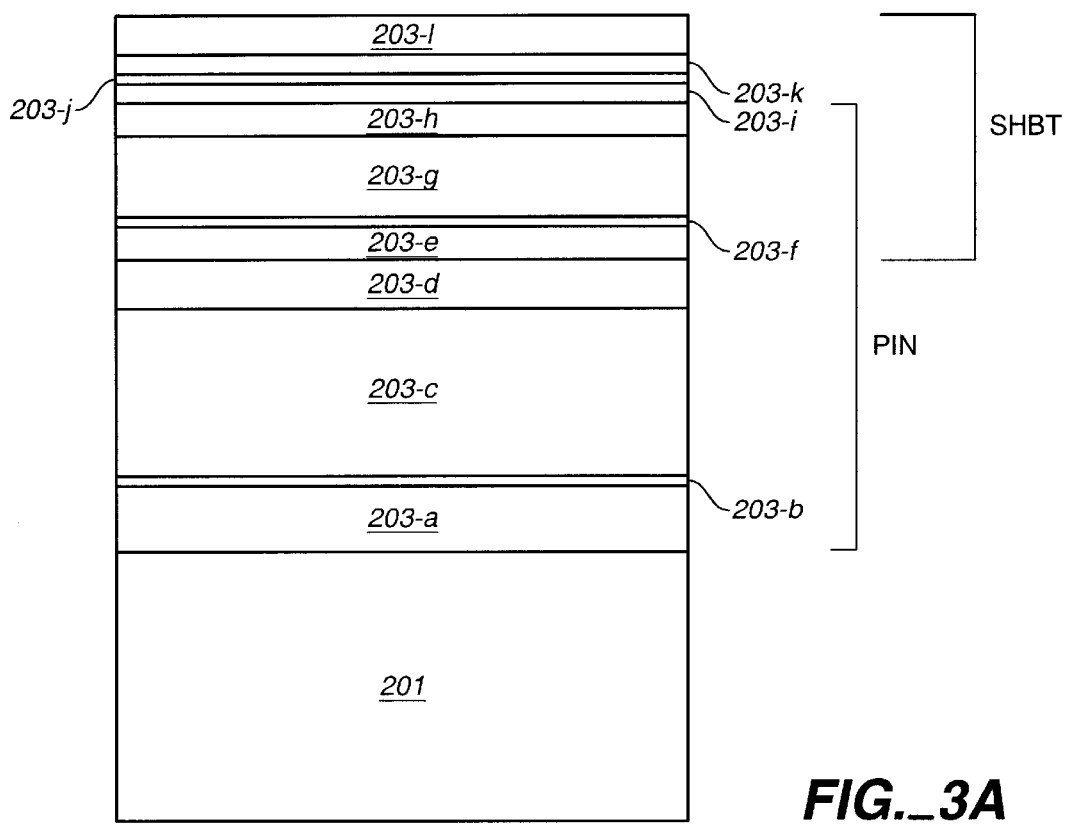
FIG._3A

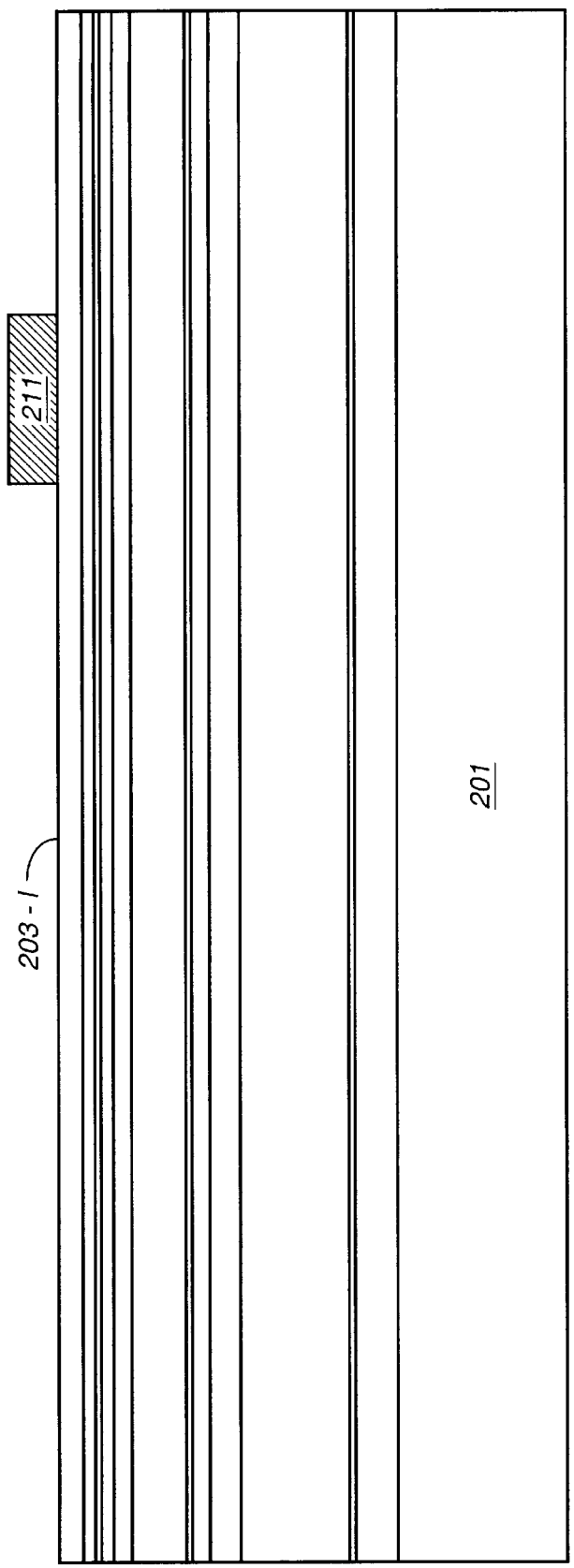
FIG._3B

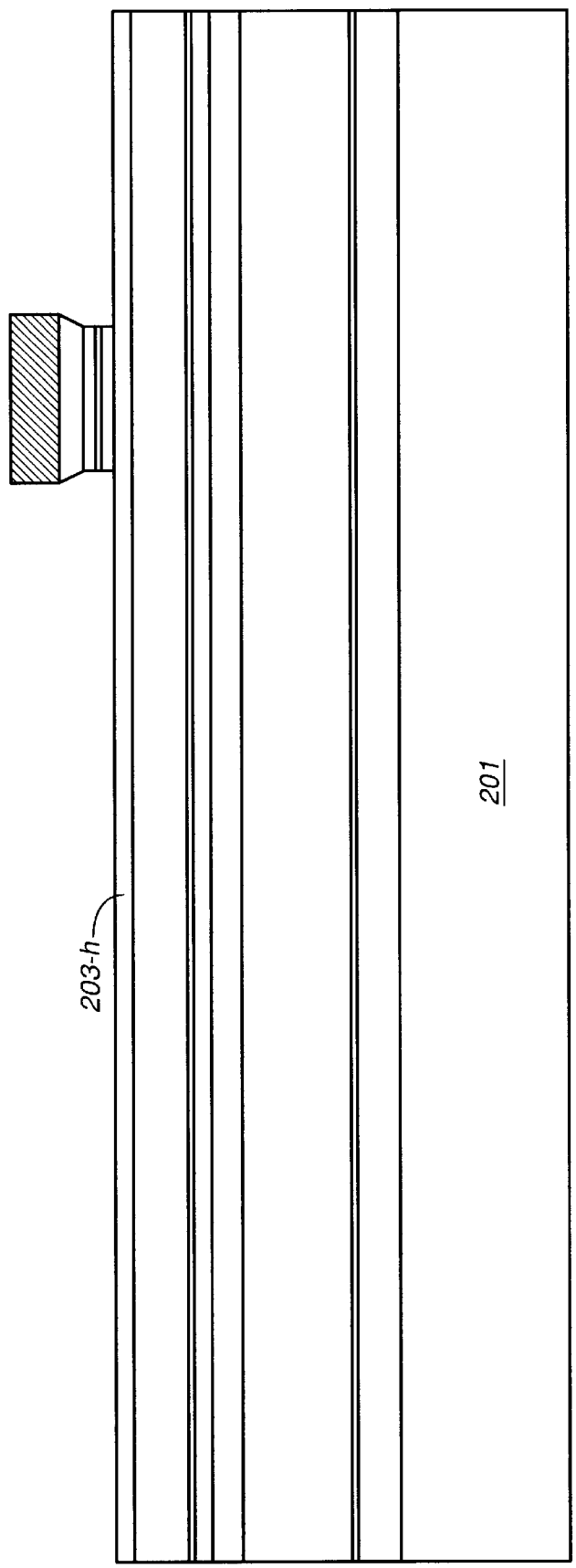
FIG._3C

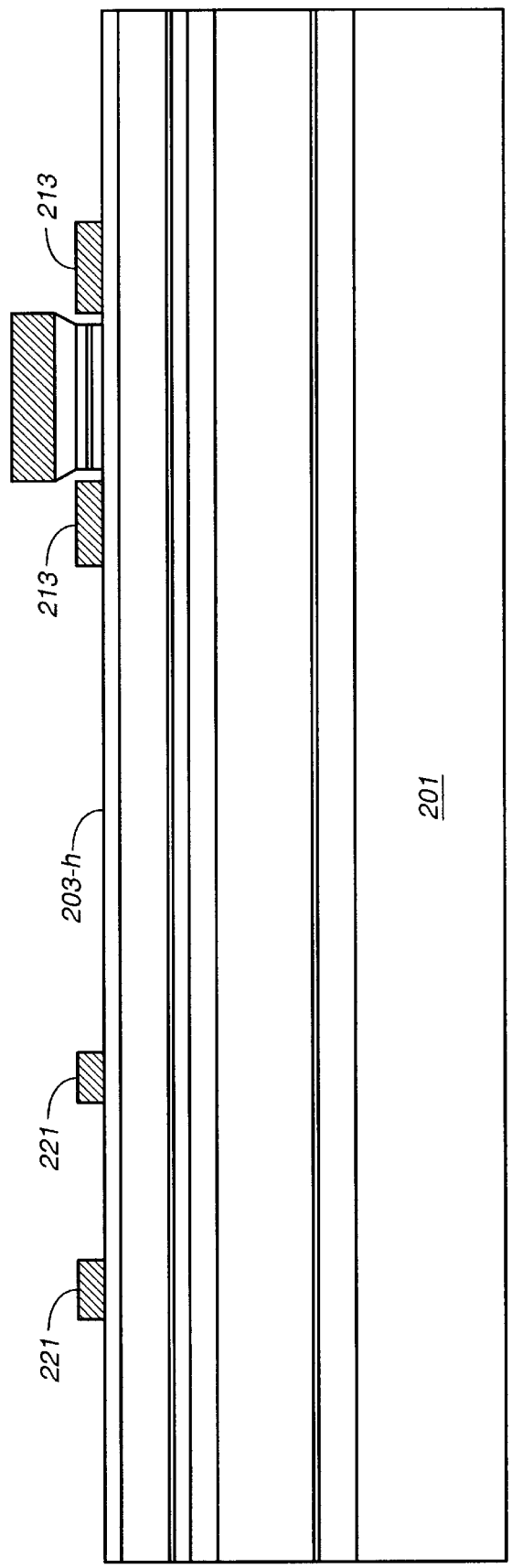

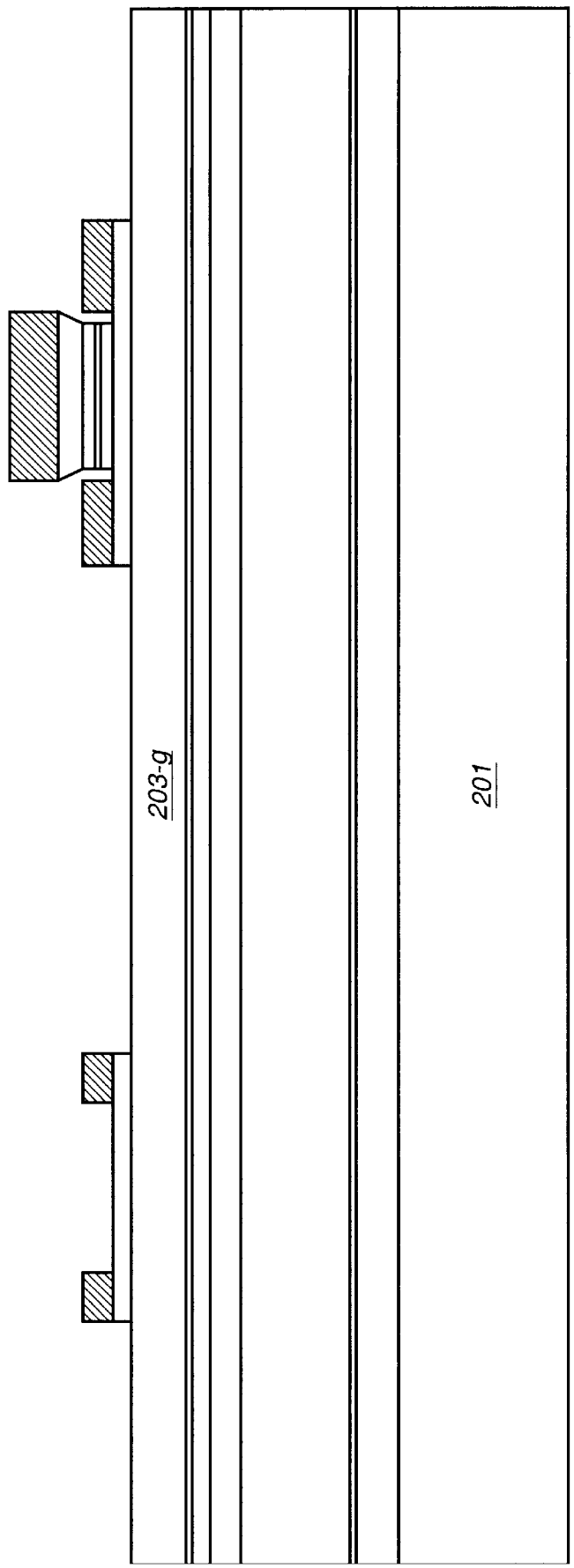
FIG._3E

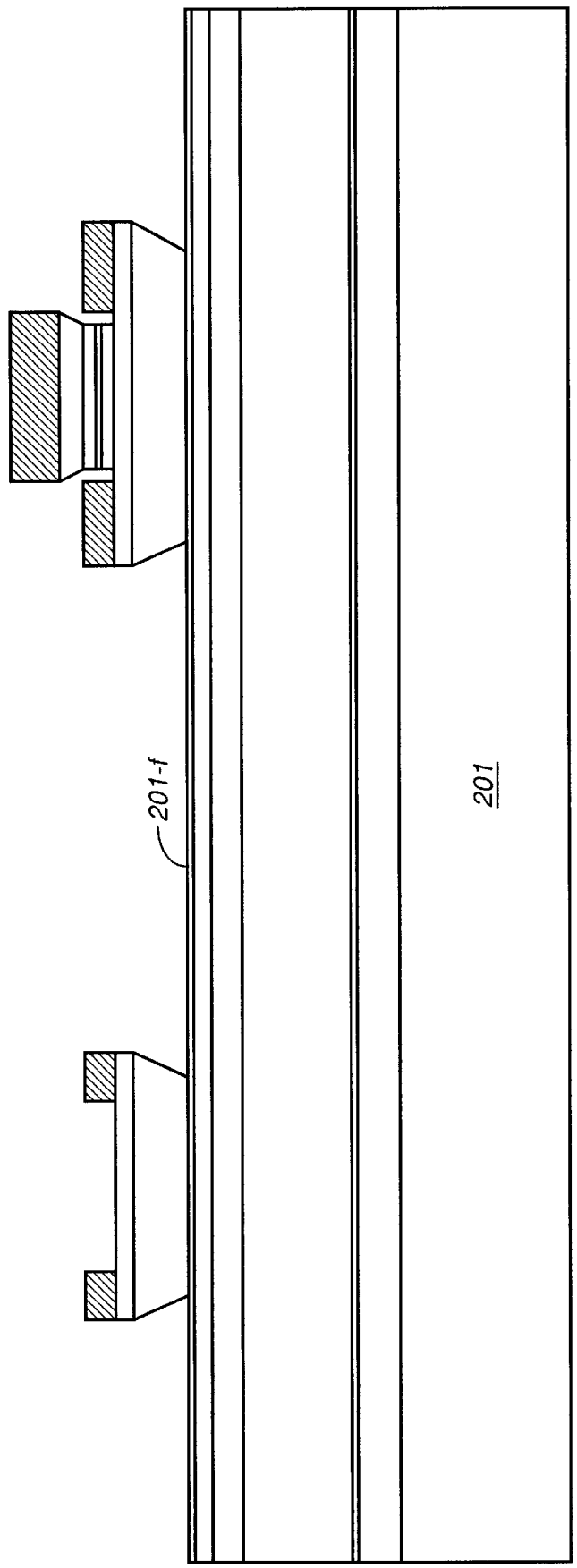
FIG._3F

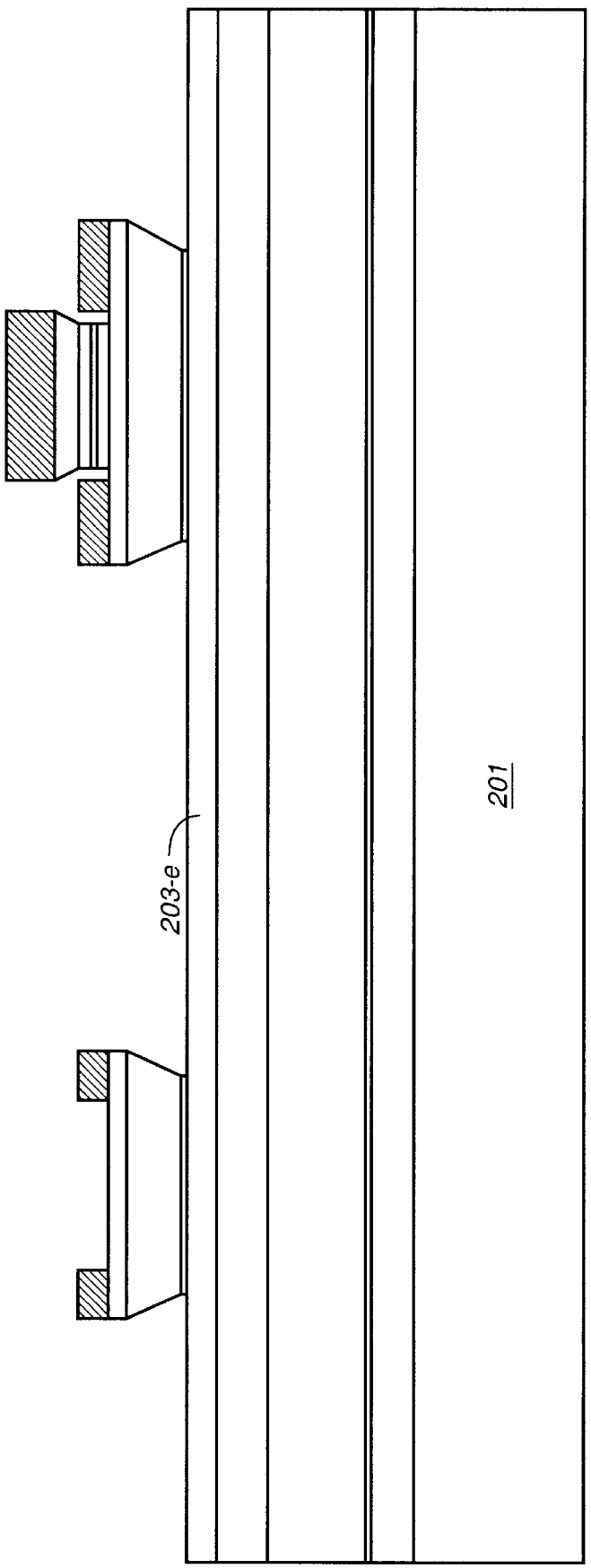
FIG._3G

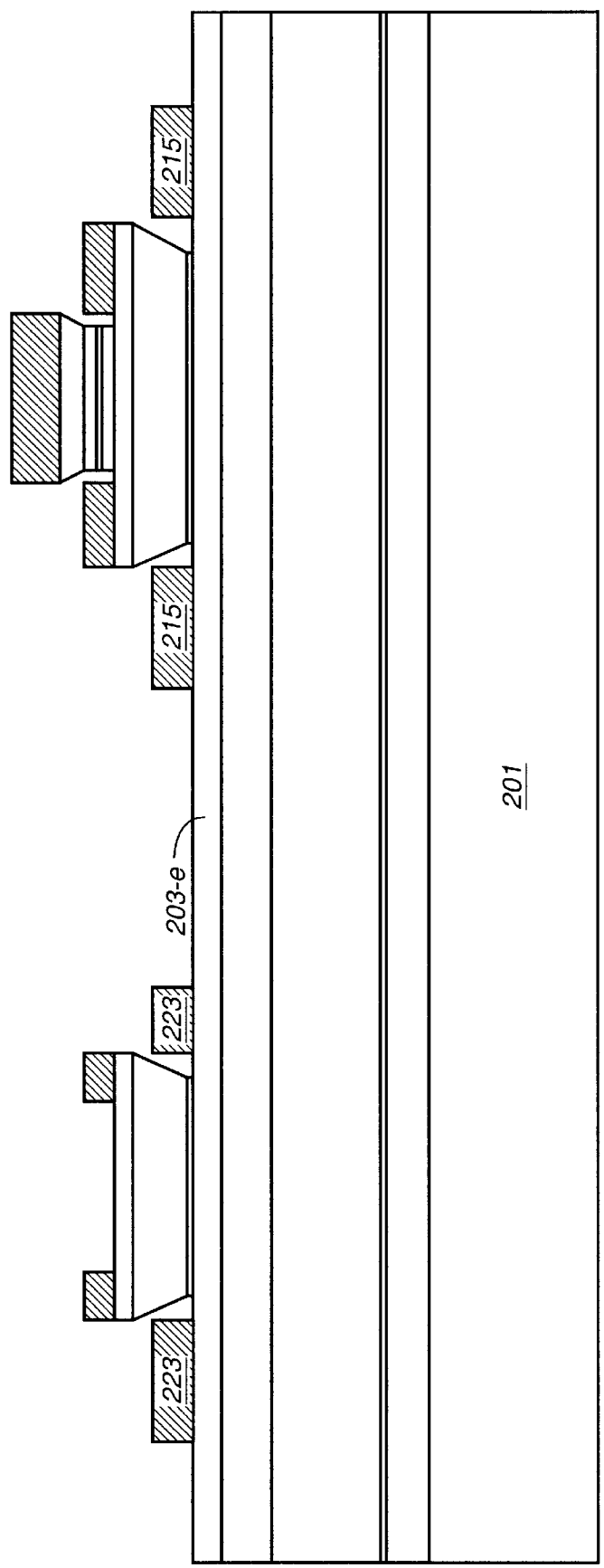
FIG._3H

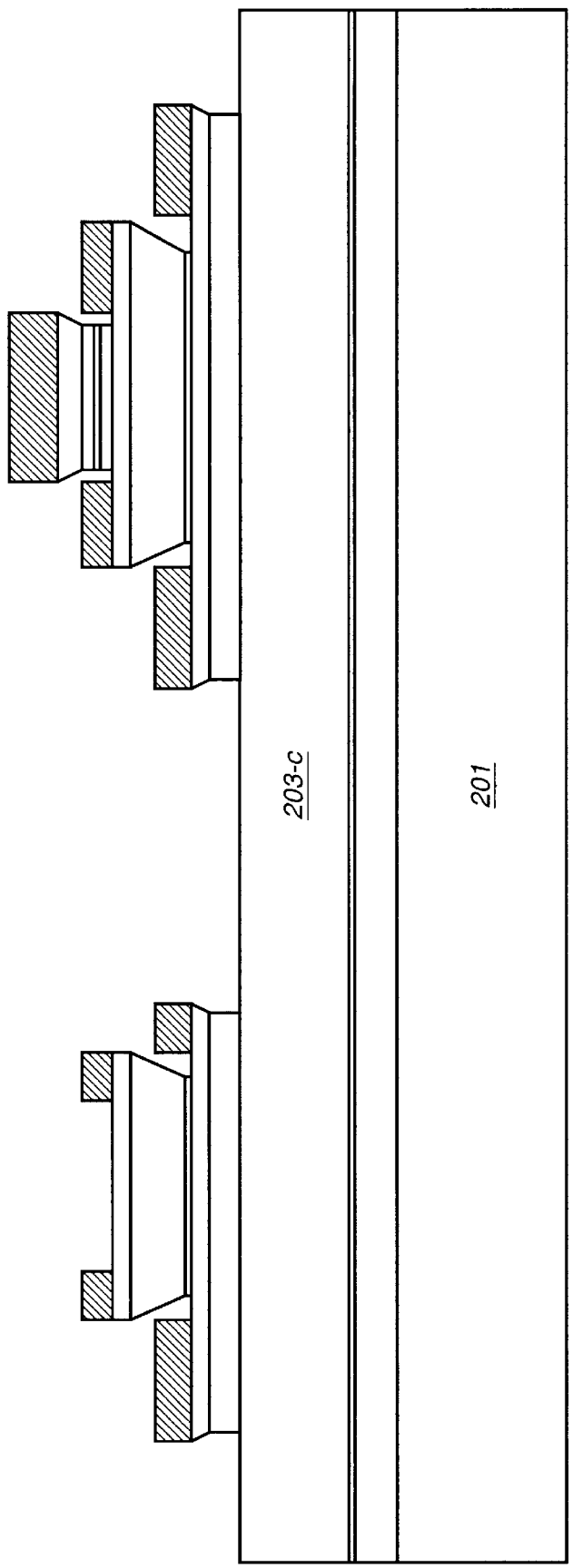
FIG._31

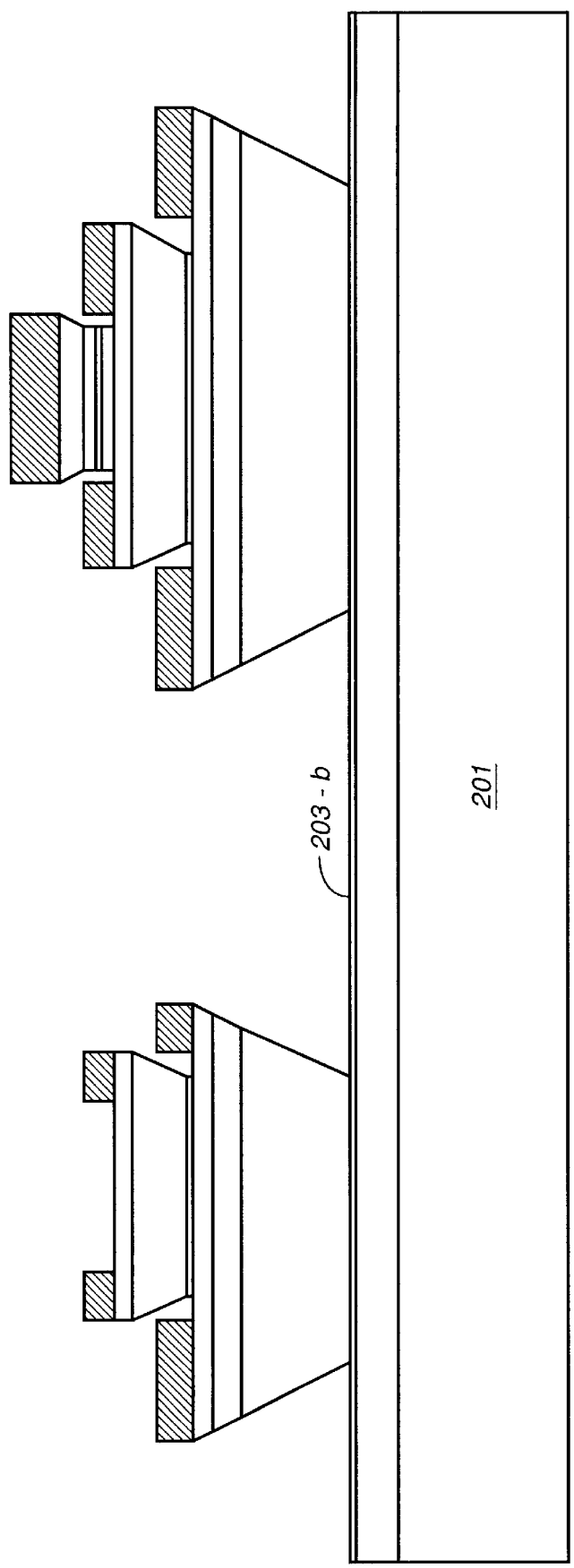
FIG._3J

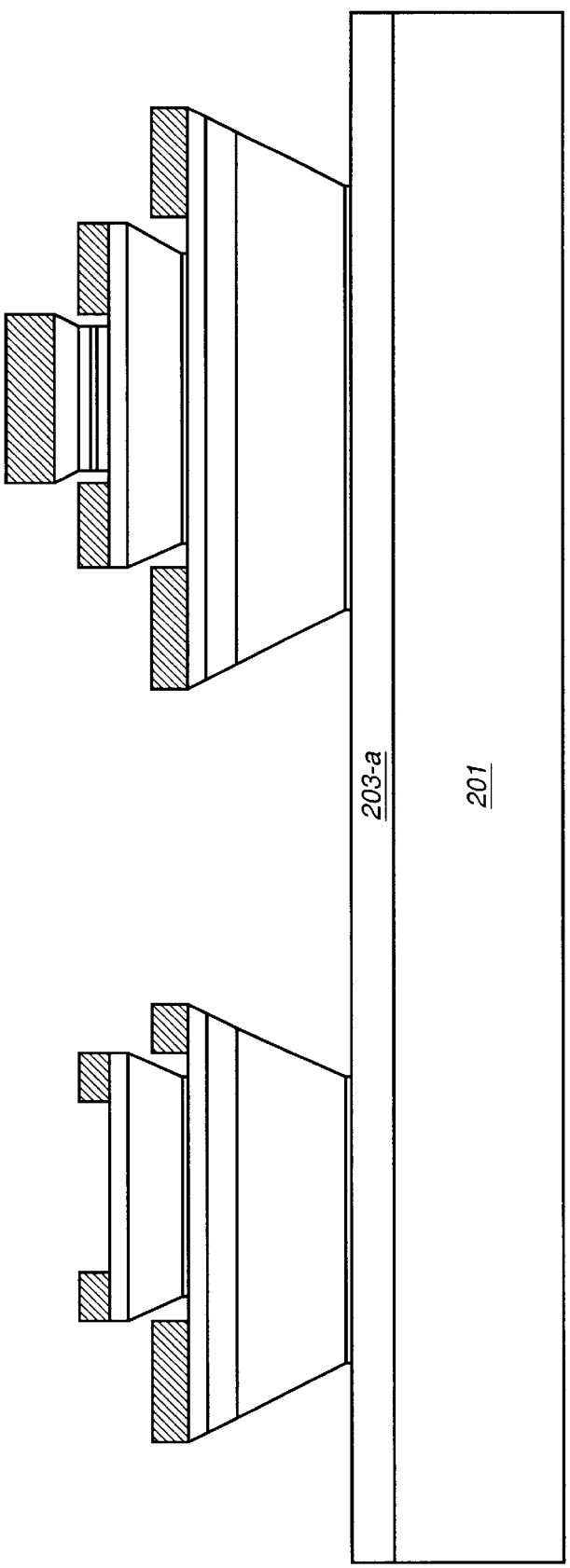
FIG._3K

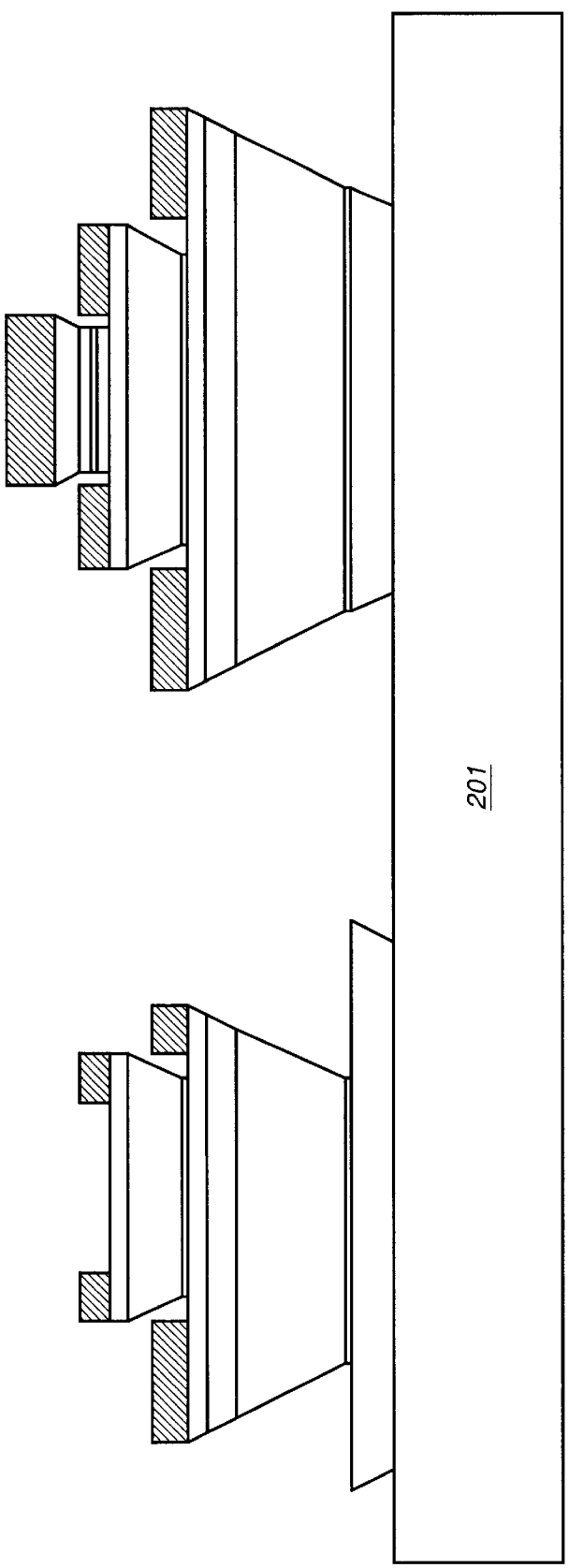
FIG._3L

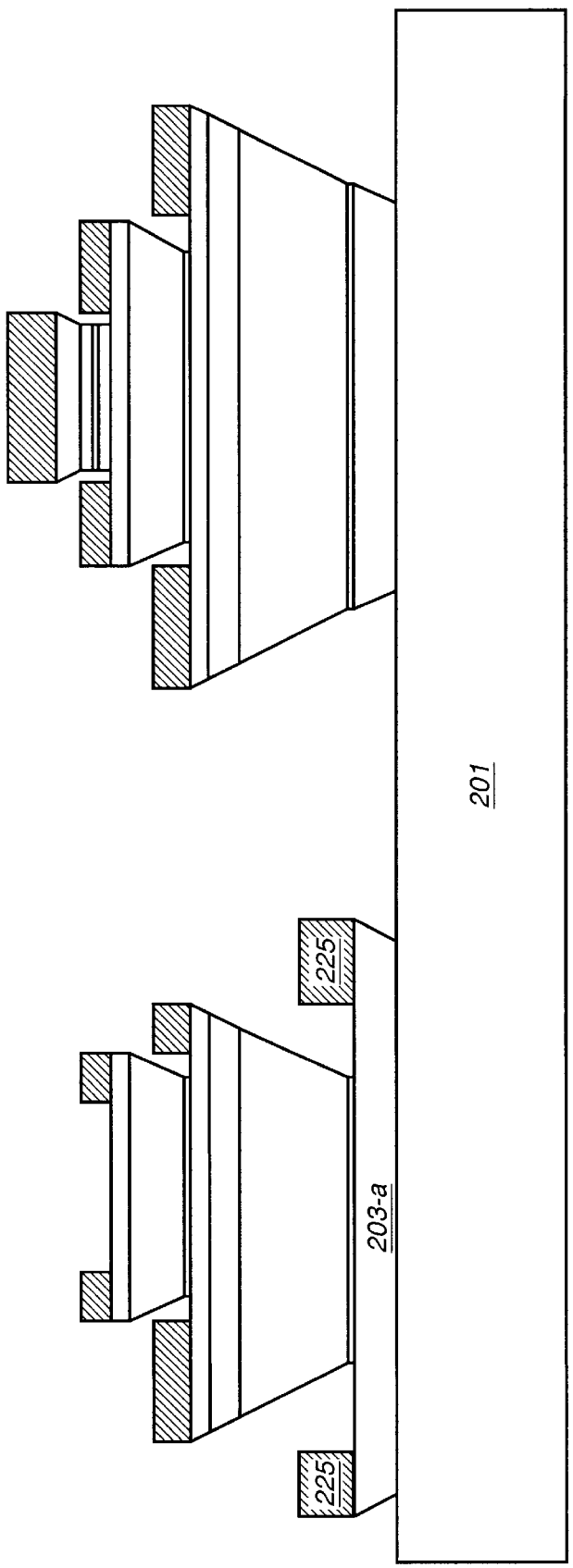
FIG._3M

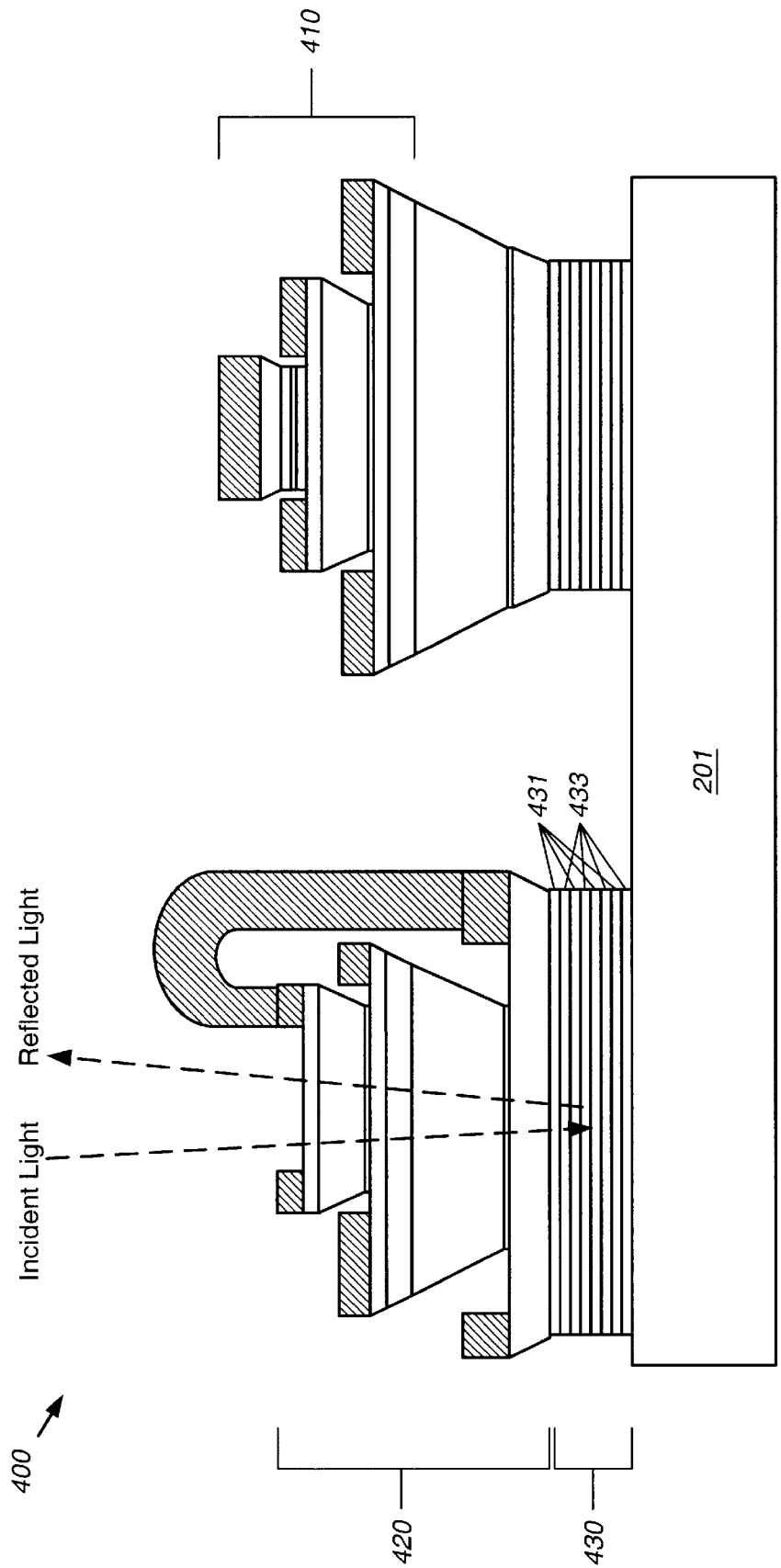
FIG._4

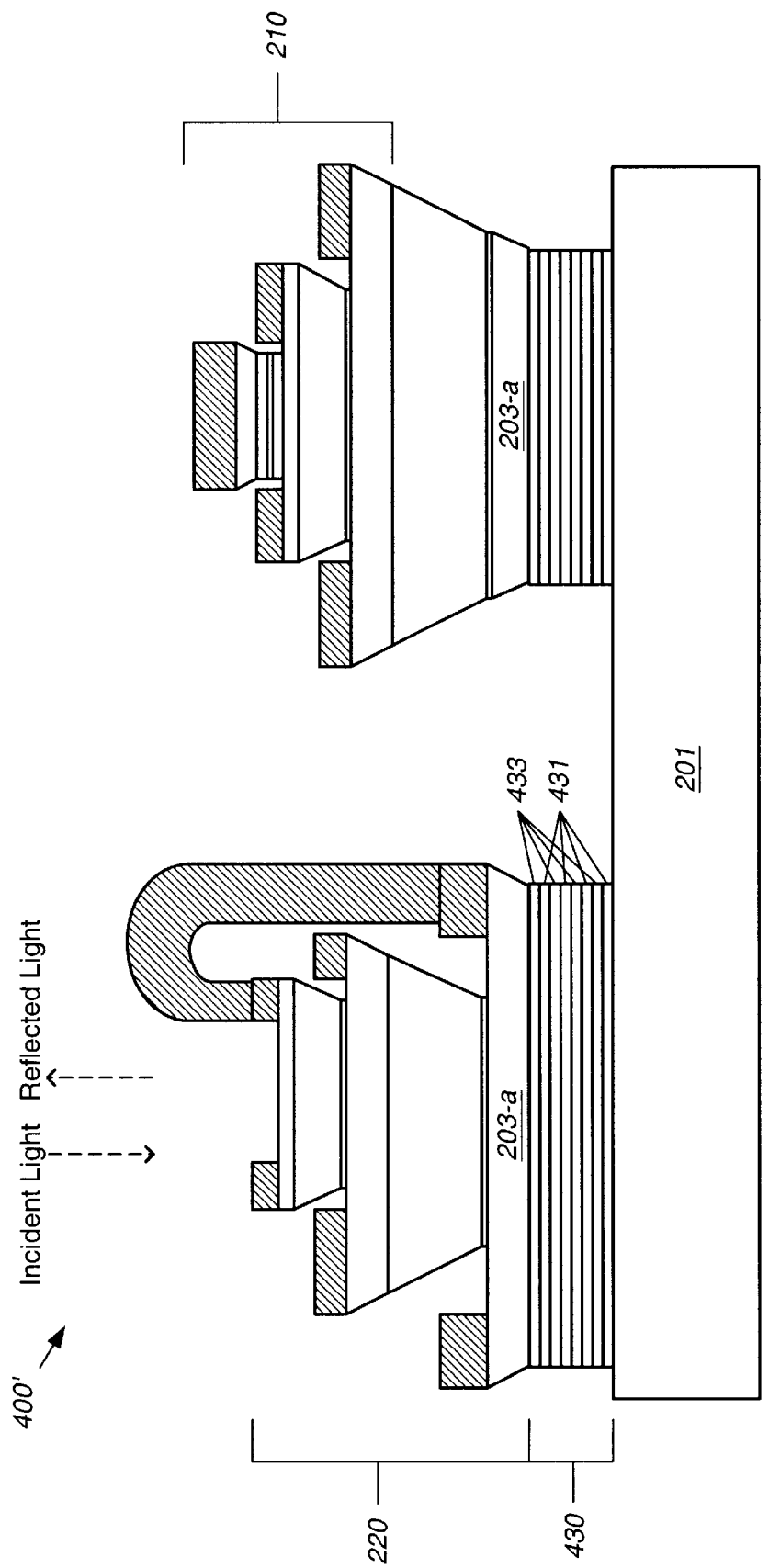
FIG._5

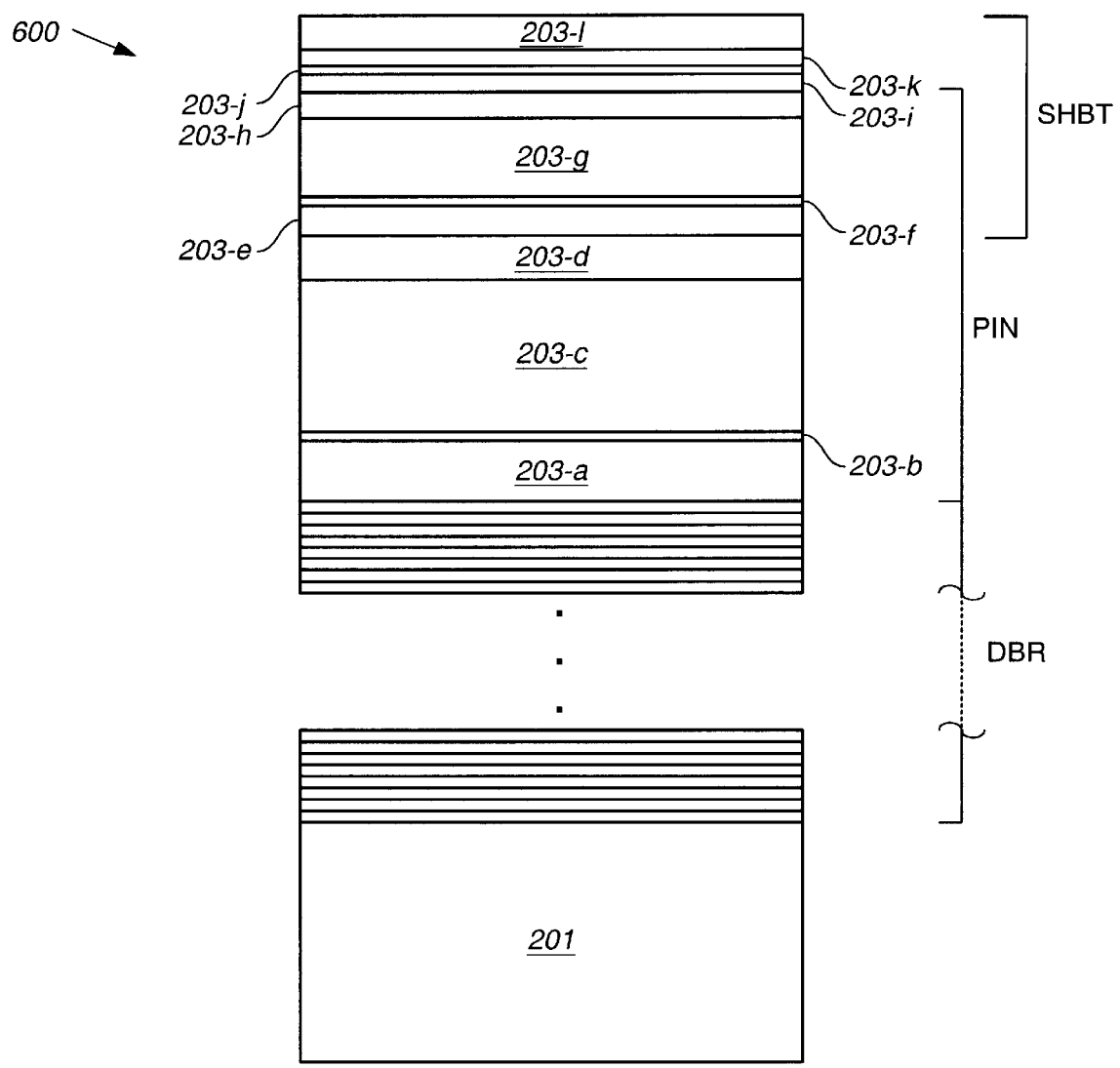
FIG._6

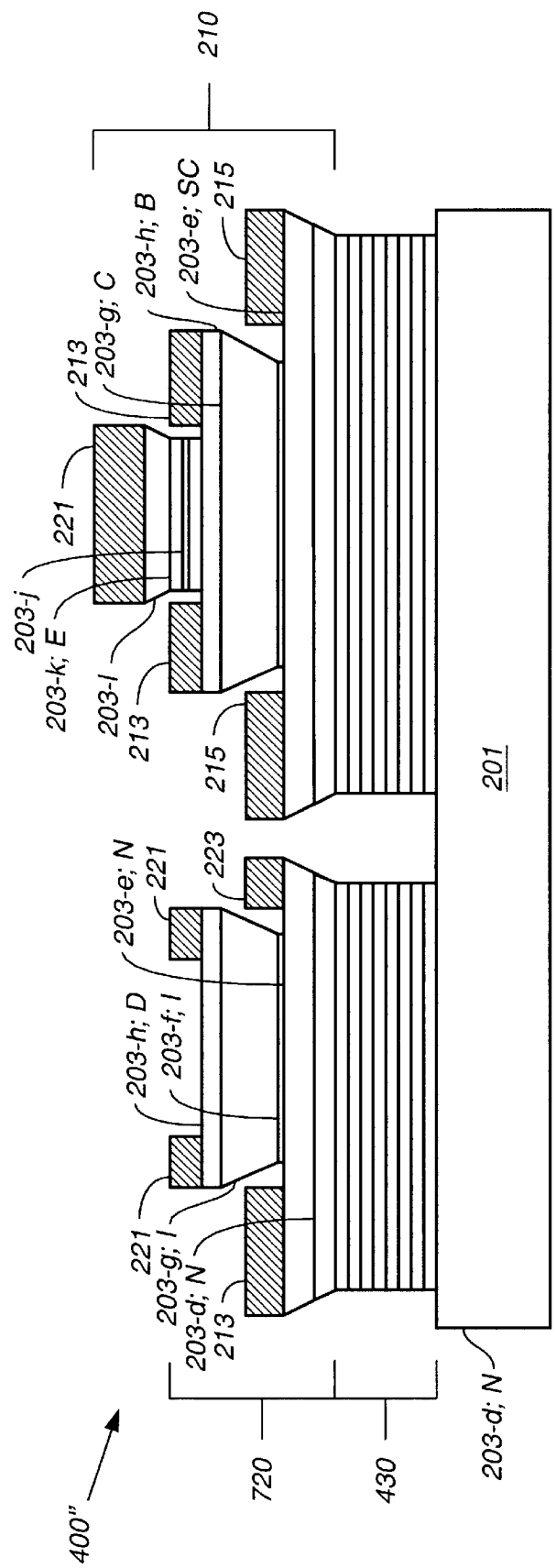

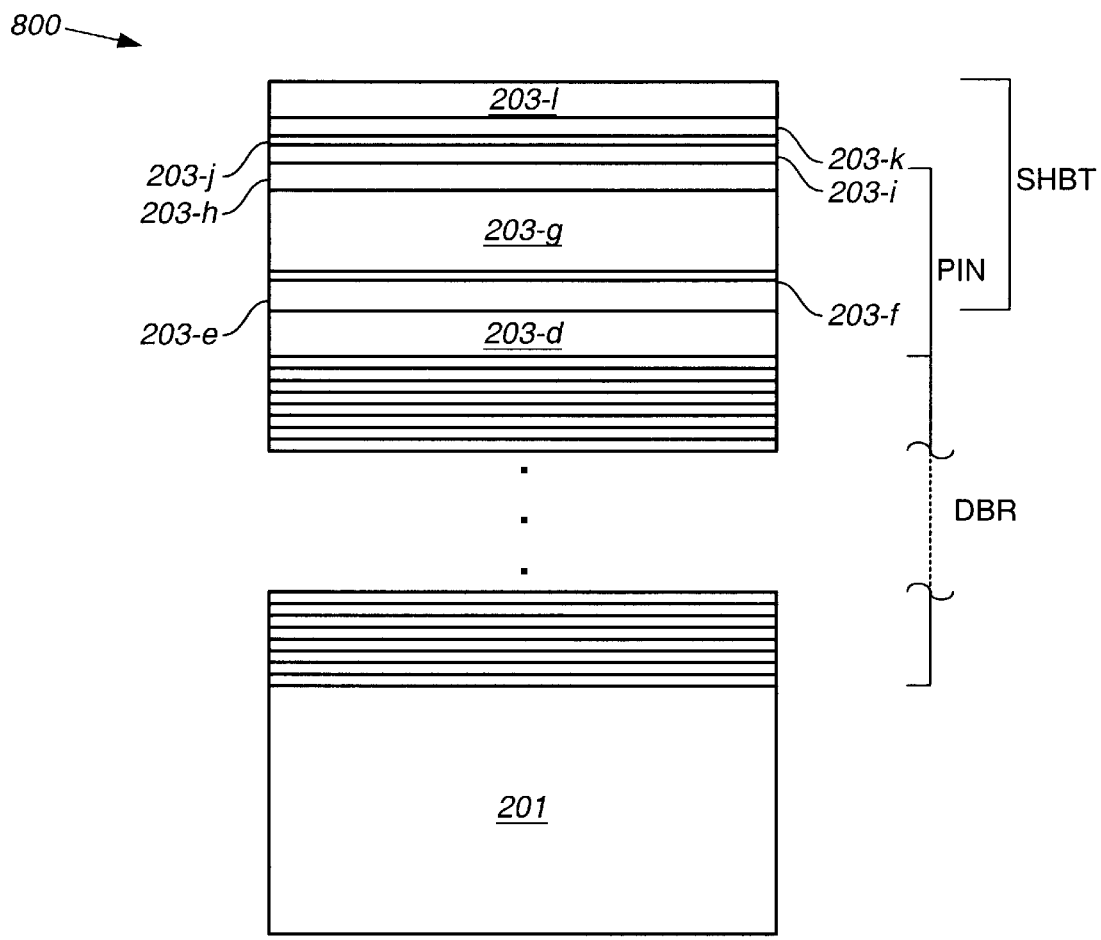
FIG._8A

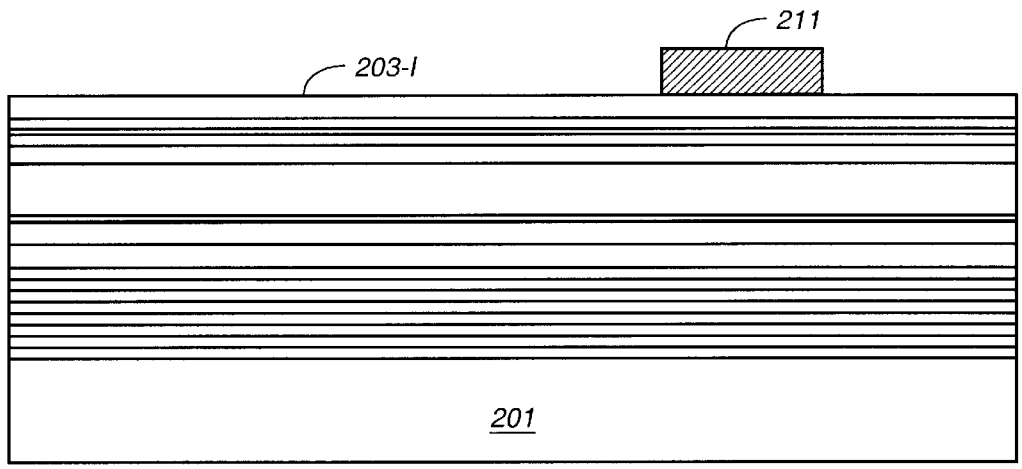
FIG._ 8B
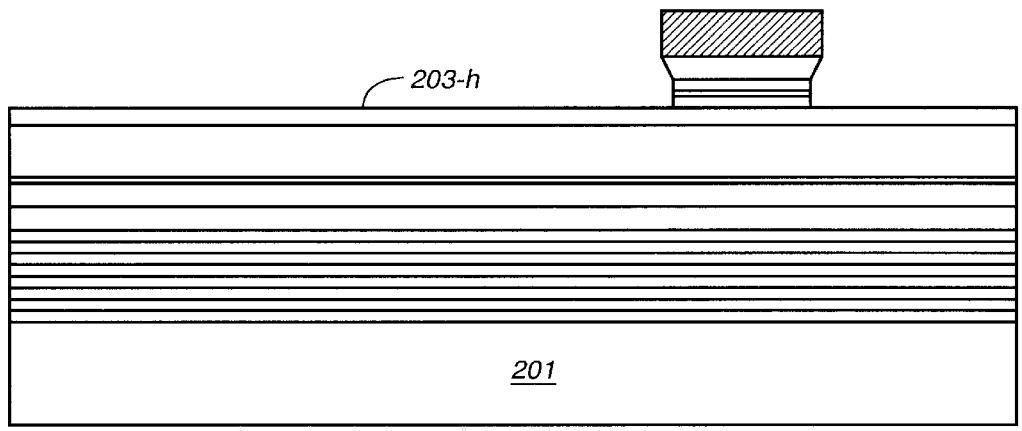
FIG._ 8C
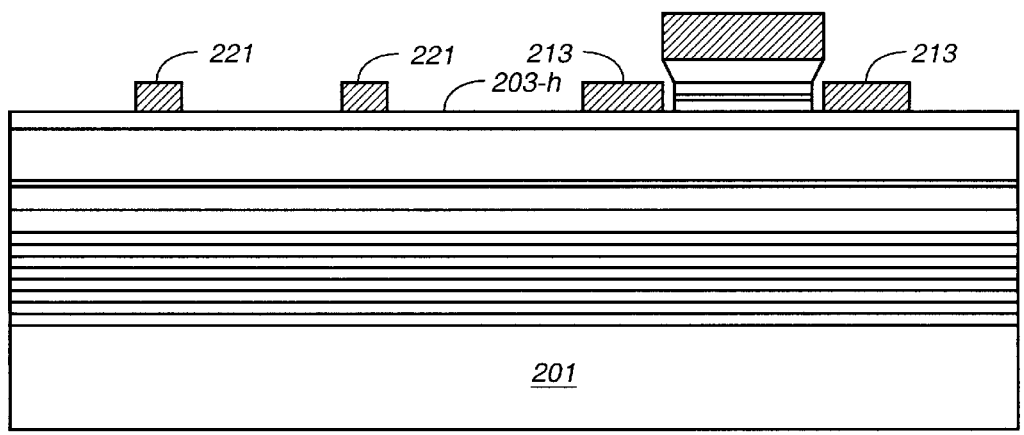
FIG._ 8D

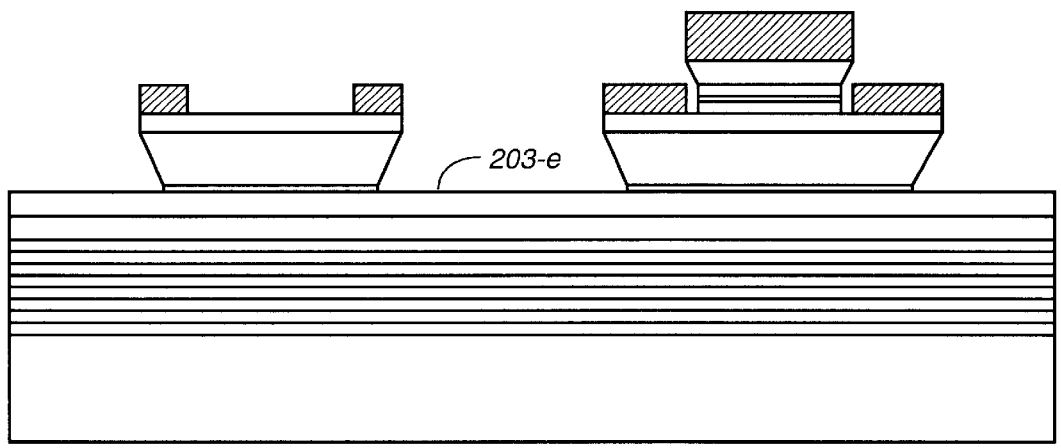
FIG._ 8E
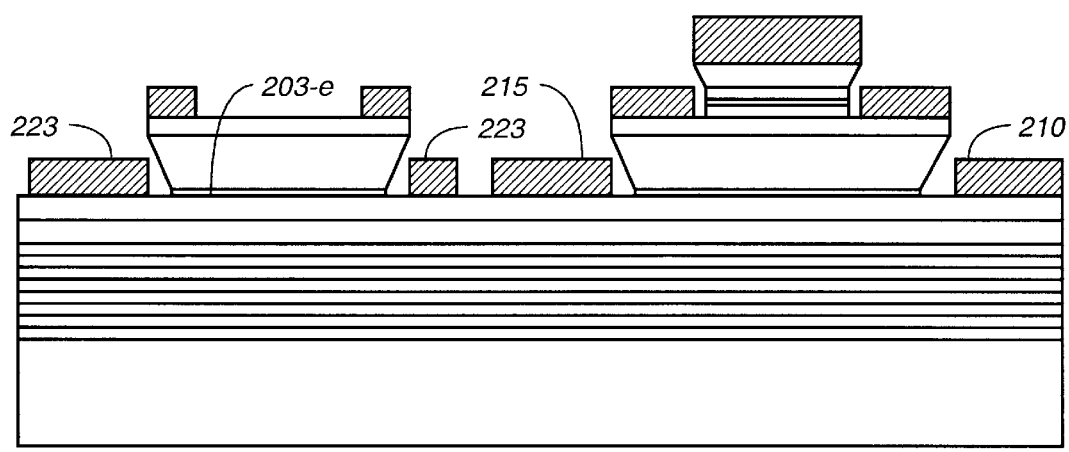
FIG._ 8F

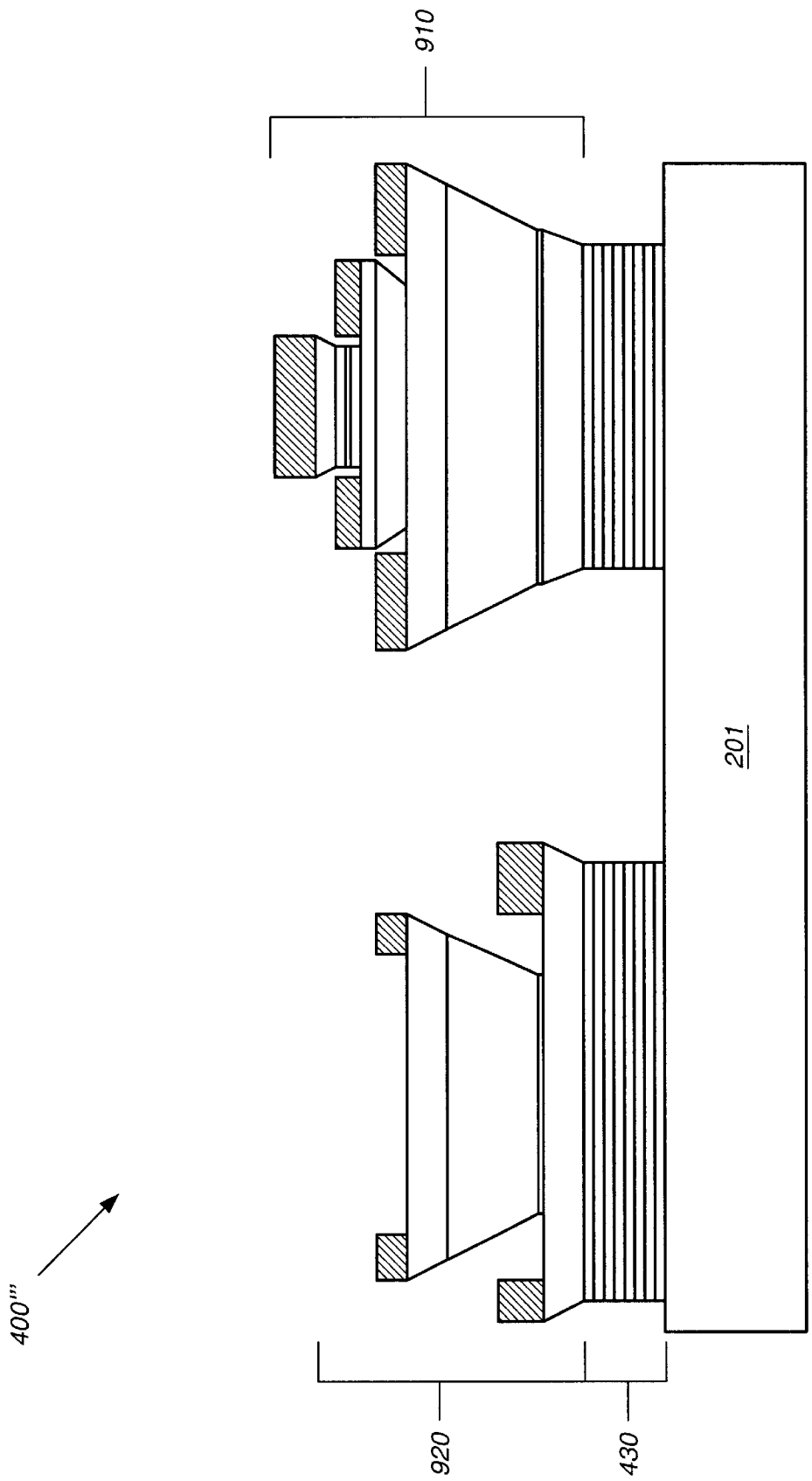
FIG._9

INTEGRATED PHOTODETECTOR AND HETEROJUNCTION BIPOLAR TRANSISTORS

FIELD OF THE INVENTION

The present invention relates to optoelectronic devices and, in particular, to the integration of photodetectors and transistors integrated on a substrate.

BACKGROUND OF THE INVENTION

The speed at which optical networking devices operate can be increased by using integrated circuits that provide both optical and electronic functions. Optoelectronic integrated circuits (OEICs), in particular, combine photodetectors, which convert optical to electronic signals, with transistors, used to electronically amplifying the detector signals, on a single substrate. Integrating these components on a substrate circuit has the potential to greatly increase the speed (in excess of 40 Gb/s) and to decrease the cost of high-speed networking components through the development of compact optical circuits for optical networking.

One technique for developing components that allow for OEICs is the integration of p-i-n photodiodes (PIN-PDs) with single heterojunction bipolar transistors (single HBT, or SHBT), referred to herein as "PIN/HBT integration." HBTs have proven large-scale integration capability and also have the potential for use as optical transceiver modules with signal processing front ends such as multiplexer, de-multiplexer, and clock-and-data-recovery circuits. PIN/HBT integration is based on structural similarities of certain PIN-PDs and SHBTs that allow these components to be fabricated from a single stack of semiconductor layers. In particular, it is known that a stack of semiconductor layers can be used to form both the base and collector of a SHBT and a PIN-PD. For example, one prior art circuit is based on a separate PIN-PD structure grown on the bottom of a HBT structure which includes a SHBT and a double HBT (DHBT) on top of the PIN-PD structure. While this allows for integration of photodiodes and transistors, this approach suffers from several drawbacks that limit the application of such devices to high-speed applications, such as the inability to produce photodiodes with high responsivity to light and transistors that operate at high speed when the devices are formed from the same semiconductor layers.

Other techniques have also been developed or proposed based on the etching and regrowth of structures. One prior art device uses an epitaxial PIN-PD on top of a SHBT that is located on a partially recessed indium phosphate (InP) substrate, and another has a PIN-PD that is grown on a recessed InP substrate with subsequent HBT layers grown after the removal of layers of the PIN-PD outside of the recess, for circuit planarization purposes. While these structures achieve monolithic integration of a high responsivity PIN-PD with a high-speed SHBT, manufacturability is a major concern since the regrowth technique is currently incompatible with common-practice fabrication processes, and hence is not economical.

Another technique for developing components that are compatible with OEICs is the integration of PIN-PDs with high electron mobility transistors (HEMTs) or Pseudomorphic HEMTs. One limitation of this approach is that HMET manufacturing techniques are appropriate for circuits having only a small amount of circuit integration. Another limitation of this approach is that HEMTs have limited speeds that result from noise levels that increase for bit rates greater than 2 Gb/s.

It is also desirable to increase the speed and sensitivity of the PDs in OEICs. The sensitivity of photon detection can be increased by increasing the absorption layer thickness of the PD. High-speed responsivity is limited by the transit time of the photo-generated current due to the relatively long interaction length. Many solutions have been proposed to increase the photoresponsivity while maintaining low photocurrent transit time and reasonable RC time constant. One proposed solution is to provide a waveguide photodetector. However, due to the difficulty of these light coupling schemes and the inability to produce them with monolithic integration, only discrete devices are available to date. For monolithic integration of OEICs, surface-normal photodetectors appear to be the only viable solution in the prior art. This configuration greatly limits the ability to couple light into the photodetector.

In summary, prior art techniques for integrating components in an OEIC are either too slow for high-speed use, are not amenable for use with high levels of integration, or use manufacturing techniques that are expensive or are not standard semiconductor manufacturing techniques.

What is needed is a semiconductor structure that allows for the fabrication of high-speed transistors and high responsivity photodiodes using techniques that are both economical and compatible with common fabrication techniques. Such a structure should be based on semiconductor layers and fabrication techniques that are commonly used, allowing for the production of advanced integrated circuits with a minimal amount of extra effort and expense. The resulting circuit should be based on the monolithic integration of both high-sensitivity photo-detector and high-speed, high linearity HBTs that can be used for circuits operating at 40 Gb/s or greater.

SUMMARY OF THE INVENTION

The present invention solves the above-identified problems of known OEICs by providing photodiode and transistor structures that can be fabricated using prior art semiconductor fabrication techniques from a single stack of semiconductor layers on a substrate, resulting in high-speed, linear HBTs and high-sensitivity photodetectors in a single integrated circuit.

It is one aspect of the present invention to provide a structure for forming integrated HBTs and PDs using a common stack of semiconductor layers for operation of OEICs at speeds of 40 Gb/s or greater.

It is another aspect of the present invention to provide a structure for forming integrated HBTs and PDs using a common stack of semiconductor layers. It is another aspect of the present invention that the structure allows for the integration of all InP-based and GaAs-based SHBTs and DHBT.

It is yet another aspect of the present invention to provide a structure for forming integrated HBTs and PDs that facilitate wet-etching HBT fabrication processes using current selective etching techniques, and possibly combined dry-etching such as reactive-ion-etching (RIE) or inductively-coupled-plasma (ICP) etching techniques in both GaAs- and InP-based HBTs.

It is an aspect of the present invention to provide a structure for forming integrated HBTs and PDs that can be manufactured on lattice-matched to InP substrates or on strained layers compatible with InP-based and GaAs-based semiconductors.

It is one aspect of the present invention to provide integrated optoelectronic components formed from a plurality of adjacent layers including sequential first, second and third layers on a substrate. The components include at least one single-heterojunction bipolar transistor formed from an emitter layer and from the first, second and third layers, where the first layer forms a transistor base, the second layer forms a transistor collector, and the third layer forms a transistor subcollector. The components also include at least one p-i-n-i-p photodiode formed from the first, second and third layers, where the first layer forms a photodiode p-type layer, where the second layer forms a photodiode i-type layer, and the third layer forms a photodiode n-type layer.

It is one aspect of the present invention to provide integrated optoelectronic components formed from a plurality of adjacent layers including sequential first, second and third layers on a substrate. The components include at least one p-i-n-i-p photodiode formed from the plurality of layers and at least one single-heterojunction bipolar transistor formed from the plurality of layers, and includes adjacent p-type, i-type, and n-type layers of said at least one p-i-n-i-p photodiode.

It is another aspect of the present invention to provide integrated optoelectronic circuit components formed from a plurality of layers on a substrate. The components include a first group of the plurality of layers forming a reflector, a second group of the plurality of layers on said first group and forming at least one bipolar heterojunction transistor, and a third group of the plurality of layers on said first group and forming at least one photodiode. The reflector is positioned to double-pass light through said at least one photodiode by reflecting light transmitted through the at least one photodiode back through said photodiode.

A further understanding of the invention can be had from the detailed discussion of the specific embodiment below. For purposes of clarity, this discussion refers to devices, methods, and concepts in terms of specific examples. However, the method of the present invention may be used to connect a wide variety of types of devices. It is therefore intended that the invention not be limited by the discussion of specific embodiments.

BRIEF DESCRIPTION OF THE DRAWING

The foregoing aspects and the attendant advantages of the present invention will become more readily appreciated by reference to the following detailed description, when taken in conjunction with the accompanying drawings, wherein:

FIG. 1 is a sectional view illustrating a first embodiment semiconductor structure of the present invention;

FIG. 2 is a sectional view of a second embodiment semiconductor structure having a SHBT and a p-i-n-i-p photodiode;

FIGS. 3A–3M are sectional views of one method for manufacturing the semiconductor structure of FIG. 2;

FIG. 4 is a sectional view of a third embodiment structure having both a bipolar transistor and photodiode on top of a DBR structure;

FIG. 5 is a sectional view of a fourth embodiment semiconductor having both a SHBT and a p-i-n-i-p photodiode on top of a DBR structure;

FIG. 6 is a sectional view of a semiconductor layer stack for producing the structure of FIG. 5;

FIG. 7 is a sectional view of a fifth embodiment semiconductor having a SHBT, a p-i-n photodiode and a DBR structure between the SHBT/photodiode;

FIGS. 8A–8F are sectional views of one method for manufacturing the semiconductor structure of FIG. 7; and FIG. 9 is a sectional view of a sixth embodiment semiconductor having a DHBT, a p-i-n photodiode and a DBR structure between the SHBT/photodiode.

Reference symbols are used in the Figures to indicate certain components, aspects or features shown therein, with reference symbols common to more than one Figure indicating like components, aspects or features shown therein.

DETAILED DESCRIPTION OF THE INVENTION

The present invention is directed to structures that include a photodiode and a heterojunction bipolar transistor formed from a stack of semiconductor layers, where the individual layers of the stack can be produced in the same growth run. The resulting structures result in components (transistors and photodiodes) that can then be integrated on the substrate to fabricate an OEIC. In general, the inventive structures can be used to produce OEICs using any bipolar transistor structure that is compatible for growth on indium phosphate substrates, or on strained substrates on which InP-based and GaAs-based semiconductors can be fabricated. More specifically, the inventive structures include a plurality of semiconductor layers on a substrate, out of which PDs and HBTs can be fabricated from some common layers. These structures use part of the HBT structure as a PD to increase the photo-responsivity without impairing the high-frequency performance of the PD, the HBT, or the circuits fabricated with these components.

To facilitate the description of the present invention, the invention is described below in terms of specific photodiode and transistor structures that have high-speed and high-responsivity. A schematic of a first embodiment of the present invention is shown in FIG. 1 as structure 100. Structure 100 includes a substrate 101 having a SHBT 110 and a photodiode 120. Both the SHBT 110 and photodiode 120 are formed from a common stack of a plurality of semiconductor layers 103, contact pads 105 and interconnects 107. More specifically, SHBT 110 is an NPN SHBT structure having an emitter E, a base B, a collector C, and a subcollector SC. Photodiode 120 is a p-i-n-i-p photodiode (PINIP PD) with the n-type, i-type, and p-type layers indicated sequentially in FIG. 1 as a first p-type layer P1, a first i-type layer I1, an n-type layer N, a second i-type layer I2, and a second p-type layer P2. Also shown in FIG. 1 is dashed arrow representing a light beam impinging on the vertical photodiode 120. The PDs of the present invention are vertically oriented, allowing them to accept light in a direction toward the substrate. In general, the PDs can detect light that is not parallel to the substrate surface, though it is preferable that the light is normal to the substrate and that it approaches the substrate from above. Structure 100, and all of the structures described herein, may includes other layers, such as the thin etch stop layer ES, that aid the manufacturing of components from layers 103 but that do not appreciably alter the optical or electronic operation of the components.

The junction of base B and collector C of SHBT 110 are formed from the same layers as a p-type and i-type layer (P1 and I1, respectively) of photodiode 120, and thus a portion of the PD structure is included in the layers of the SHBT. Additionally, and in contrast with structures of the prior art, structure 100 includes an additional photodiode formed by the layers I2 and P2 that are located between the particular layers 103 that form SHBT 110 and substrate 101. Structure 100 thus consists of an additional photodiode junction, formed by the junction of the layers N, I2 and P2 and electrically interconnected with metal interconnect 107 to form a parallel-connected PIN diode. Structure 100 allows incident light to pass through two photodiode junctions (P1-I1-N and N-I2-P2), greatly increasing the photoresponsivity of the photodiode 120. In addition, the photodiode junction layers forming layers N-I2-P2 are below SHBT 110, and are not electrically used in the SHBT and do note affect the performance of the bipolar transistor. In summary, the advantages of structure 100 include 1) enhanced photodetector responsivity due to a longer optical absorption pass, with no compromise in the HBT performance, and 3) only a slightly more complicated fabrication procedure over more conventional HBT fabrication processes.

Structure 100 is configured for detecting light of a wavelength of about 1.55 μm, as in proposed applications of OEICs, through the use of an InP/Indium gallium arsenide (InGaAs) PINIP PD. Specifically, the InP/InGaAs layers are lattice-matched to InP and have absorption layers I1 and I2 for absorption at 1.55 μm. In the p-i-n-i-p photodiode structure, special care must be taken in the n-layer of a photodiode to reduce the futile photon absorption through majority carrier relaxation while maintaining a low sheet resistance of the n-type contact layer for both the HBTs and the photodiodes. The n-layer of the photodiode should consist of a highly-doped wide bandgap material, such as InP and indium aluminum arsenide (InAlAs), along with a thin and highly-doped low bandgap material, such as InGaAs. The incorporation of a wide bandgap material produces a photo-transparent layer for a given photonic energy, while maintaining the sheet resistance a reasonable, low value. The use of a highly-doped material as required for the n-type layer minimizes the current blocking effect for lower part of the PINIP PD (layers I2 and P2). Preferably, P1 has an anti-reflection (AR) coating to increase the amount of light passing through the PD.

A second embodiment of structure 100 is shown in FIG. 2 as a structure 200 that includes an NPN SHBT 210 and a PINIP PD 220 having layer definitions (materials, types, doping and thicknesses) as listed in Table I. HBT 210 and photodiode 220 are formed from a common stack of sequential semiconductor layers 203, indicated as layers 203-a to 203-l on a substrate 201, as well as several pads 211, 213, 215, 221, 223, and 225 and a metal interconnect 227. Several of the layers 203 are also labeled to indicate their function in the resulting structures, as in FIG. 1. The layer definitions of structure 200 are exemplary layers for a stack that is lattice-matched to an InP substrate 201 having an InP/InGaAs HBT 210 monolithically integrated with a p-i-n-i-p photodetector 220, and are not meant to limit the scope of the invention. The formation of this, and all stacks, of the present invention can be fabricated by readily available epitaxial equipments such as MBE and MOCVD.

TABLE I

Exemplary Layer Definitions for the Second Embodiment Integrated PIN/HBT Structure, where PD is Photodiode; UID is Unintentionally Doped; S.I. is Semi-insulating; and + is Heavily Doped.

| Layer No. | HBT | PD | Material | Type | Doping (cm$^{-3}$) | Thickness (Å) |
|---|---|---|---|---|---|---|
| 203-l | Cap | — | InGaAs | N+ | $10^{19}$ | 1500 |
| 203-k | Emitter | — | Inp | N | $10^{18}$ | 400 |
| 203-j | DESL | — | InGaAs | N | $5 \times 10^7$ | 50 |
| 203-i | — | — | InP | N | $10^{17}$ | 300 |

TABLE I-continued

Exemplary Layer Definitions for the Second Embodiment Integrated PIN/HBT Structure, where PD is Photodiode; UID is Unintentionally Doped; S.I. is Semi-insulating; and + is Heavily Doped.

| Layer No. | HBT | PD | Material | Type | Doping (cm$^{-3}$) | Thickness (Å) |
|---|---|---|---|---|---|---|
| 203-h | Base | P1 | InGaAs | P+ | $4 \times 10^{19}$ | 500 |
| 203-g | Collector | I1 | InGaAs | UID | $10^{16}$ | 3000 |
| 203-f | Etch Stop | I1 | InP | UID | $10^{16}$ | 200 |
| 203-e | Subcollector | N | InGaAs | N+ | $10^{19}$ | 1000 |
| 203-d | — | N | InP | N+ | $5 \times 10^{18}$ | 2000 |
| 203-c | — | I2 | InGaAs | UID | $10^{16}$ | 5000 |
| 203-b | — | I2 | InP | UID | $10^{16}$ | 200 |
| 203-a | — | P2 | InGaAs | P+ | $4 \times 10^{19}$ | 1000 |
| 201 | Substrate | | InP | S.I. | | |

The layers of structure 200 include (from bottom to top) a heavily-doped p-InGaAs for p-type contact 203-a of the lower stack of PIN diode 220, an i-InP layer for etch stop 203-b, an i-InGaAs absorption layer 203-c, and an n-type InP 203-d. Layers 203-e to 203-h form the remainder of photodiode 220 and HBT 210. These layers consist of an n+-InGaAs HBT subcollector and an n-type photodiode layer 203-e, an InP etch stop layer 203-f, an InGaAs HBT collector and an i-type photodiode layer 203-g, and a carbon-doped, p+-InGaAs base with doping level over $10^{19}$ cm$^{-3}$ and p-type photodiode layer 203-h. The uppermost layers 203-i to 203-l form the remaining upper portion of HBT 210, with DESL layers 203-i and 203-j, an n-type InP emitter layer 203-k, and an InGaAs cap layer 203-l.

Thus HBT 210 is formed from layers 203-e to 203-l, with layer 203-e forming the subcollector, layer 203-f forming a etch stop, layer 203-g forming the collector, layer 203-h forming the base, layers 203-i and 203-j forming a dual etch stop emitter ledge (DESL), layer 203-k forming the emitter, and layer 203-l forming the cap. In addition to layers 203-e to 203-l, HBT 210 includes pads 211, 213, and 215 to provide external connections to the HBT, with pad 211 on top of cap 203-l, pad 213 on top of base B (layer 203-l), and pad 2153 on top of subcollector SC (layer 203-e).

PINIP PD 220 is formed from layers 203-a to 203-h, with layer 203-a forming the second p-type layer P2, layers 203-b and 203-c forming the second i-type layer I2, layers 203-d and 203-e forming the n-type layer N, layers 203-f and 203-g forming the first i-type layer I1, and layer 203-h forming the first p-type layer P1. In addition to layers 203-a to 203-h, photodiode 220 includes a pair of pads 221 on layer P1 and a pair of pads 225 on layer P2, and interconnect 227 between one of each of the pair of pads 221 and 225 to electrically connect the two p-type layers, and the other of the pair of pads 221 and 225, as well as pad 223 to provide external electrical connections to the p-type and n-type layers, respectively. In general, substrate 201 can include a multitude of structures 210 and 220, as well as other optical, electronic, or optoelectronic devices that are wired through combinations of conducting and insulating layers or vias to form a functional OEIC.

The structure 200 thus provides for the formation of a photodiode having two photodiode junctions (the P1-I1-N and N-I2-P2 layers of PINIP PD 220) alongside HBT 210, with sequential layers 203-a to 203-h used for forming photodiode 220, and sequential layers 203-e to 203-l used for forming HBT 210. Note that HBT 130, unlike prior art HBT/p-i-n photodiode structures, includes layers 203-a to 203-d between HBT 210 and substrate 201 that are not functionally required for the HBT, but that allow photodiode 220 and HBT 210 to be formed from the layers 203, while providing an additional photodiode interface to increase the photoresponsivity of the photodetector.

The lower-stack PIN photodiode (layers 203-a to 203-e) of photodiode 220 shares n-type region, layer 107, with HBT 210. The p-type contacts of both top and bottom photodetectors (layers 203-a and 203-h) are connected through a metal interconnection layer 227 to pads 221 and 225 connected to layers 203-h and 203-a, respectively, forming a parallel-connected PIN diode. The choice of materials, doping and thickness are selected to optimize the operation of photodiode 220 and HBT 210 to produce uniform PIN/HBT device performance for 1.55 µm-wavelength absorption. As indicated in Table I, structure 200 has a photodiode n-layer consisting of a highly-doped wide bandgap material 203-d, such as InP, along with a thin and highly-doped low bandgap material, such as InGaAs layer 203-e.

HBT 210 is expected to have an $f_T$ greater than 160 GHz and a $f_{max}$ of greater than 220 GHz. When combined with photodiode 220, it is expected to produce a device having a photo-responsivity of greater than 0.5A/W with a 3 dB optical-to-electrical bandwidth around 40 GHz for photodetectors with 10 µm-diameter optical illumination window.

While structure 200 has been described using InGaAs and InP layers, the invention is not so limited, and many alternative embodiments are within the scope of the present invention. Materials for fabricating the inventive structures include emitter and collector layers such as InP, ternary compounds, such as InGaAs and InAlAs, or quaternary compound semiconductors including aluminum gallium indium arsenide (AlGaInAs), gallium indium arsenide phosphide (GaInAsP), and gallium indium arsenide antimonide (GaInAsSb). In addition, the base layer is not limited to InGaAs. Antimony-based materials such as gallium arsenide antimonide (GaAsSb) can be used as well. The use of strained or metamorphic layers on all material systems can also be applied to the inventive structure. Examples of alternative embodiments for structure 200 are presented in Table II.

TABLE II

Alternative Layer Definitions for a the Second Embodiment Integrated PIN/HBT Structure, where PD is Photodiode; UID is Unintentionally Doped; S.I. is Semi-insulating; and + is Heavily Doped.

| Layer No. | SHBT | PD | Materials | Type | Doping (cm$^{-3}$) Range (nominal) | Thickness (Å) Range (nominal) |
|---|---|---|---|---|---|---|
| 203-l | Cap | — | InGaAs | N+ | $10^{18} - 2 \times 10^{20}$ ($10^{19}$) | 500–4500 (1500) |
| 203-k | Emitter | — | InP InAlAs InGaAlAs InGaAsP | N | $10^{16} - 5 \times 10^{18}$ ($10^{18}$) | 1000–5000 (400) |
| 203-j | DESL | — | InGaAs InGaAsP | N | $10^{16} - 5 \times 10^{18}$ ($5 \times 10^{17}$) | 300–5000 (50) |
| 203-i | | — | InP InAlAs InGaAlAs | N | $10^{16} - 5 \times 10^{18}$ ($10^{17}$) | 200–5000 (300) |
| 203-h | Base | P1 | InGaAs InGaAsP | P+ | $10^{18} - 2 \times 10^{20}$ ($4 \times 10^{19}$) | 500–1000 (500) |
| 203-g | Collector | I1 | InGaAs GaAsSb | UID | $10^{14} - 10^{18}$ ($10^{16}$) | 2000–15000 (3000) |
| 203-f | Etch Stop | I1 | InP InAlAs InGaAsP | UID | $10^{14} - 10^{18}$ ($10^{16}$) | 300–2000 (200) |
| 203-e | Sub-collector | N | InGaAs InAlAs InGaAlAs InGaAsP | N+ | $10^{17} - 2 \times 10^{20}$ ($10^{19}$) | 100–10000 (1000) |
| 203-d | | N | InP InAlAs InGaAlAs InGaAsP | N+ | $10^{17} - 2 \times 10^{20}$ ($5 \times 10^{18}$) | 100–10000 (2000) |
| 203-c | | I2 | InGaAs GaAsSb | UID | $10^{14} - 10^{18}$ ($10^{16}$) | 100–15000 (5000) |
| 203-b | | I2 | InP InAlAs InGaAsP | UID | $10^{14} - 10^{18}$ ($10^{16}$) | 100–2000 (200) |
| 203-a | | P2 | InGaAs GaAsSb | P+ | $10^{17} - 2 \times 10^{20}$ ($4 \times 10^{19}$) | 200–5000 (1000) |
| 201 | Substrate | | Inp metamorphic GaAs | S.I. | | |

Fabrication of the First Embodiment

One sequence of processing steps for producing structure 200 will now be presented in FIGS. 3A–3M. The constituent materials can be lattice-matched, strained, or metamorphically grown on semiconductor substrates. As examples, an exemplary layer structure described in Table I the previous section to illustrate the fabrication process. Due to the flexibility in epitaxial material growth, the fabrication processing sequences can be varied for certain material systems. However, the process steps proposed herein is representative and can thus be used as a guideline to the process development. Wet-etching HBT techniques can be utilized in the device fabrication, as can combined dry-etching such as RIE or ICP etching of either GaAs- or InP-based HBTs. Highly selective etch-stop layers are inserted when appropriate to ensure device performance uniformity. The detailed device-level processing steps are described as follows.

The layers used to form structure 200 are shown in FIG. 3A. The HBT processing steps are known in the prior art and well-established. The emitter contact 211 is first deposited using thermal or e-gun evaporation in a vacuum system as shown in FIG. 3B. The emitter layers 203-l to 203-k are then etched using a selective etching solution to obtain the structure of FIG. 3C The selective etching of InGaAs over InP is achieved by using citric-acid or sulfuric acid ($H_2SO_4$)-based solutions; the selective etching of InP over InGaAs is achieved using hydrochloric-acid (HCl)-based etching solutions. The selective etching solutions can be found in many publications and are well-documented.

Following the emitter etch, self-aligned base contact pads 213 and photodiode p-type pads 221 are applied as shown in FIG. 3D. This structure can facilitate either alloy-through or DESL processes. The etching of layers 203-h and 203-g, as shown in FIGS. 3D and 3E, is then preformed by the selective etching of InGaAs using, for example, citric-acid-based etching. The etching will stop automatically at the InP etch-stop layer 203-f, as shown in FIG. 3F. The InP etch-stop layer 203-f provides a well-controlled etching depth and hence improves the device performance uniformity. The etch-stop InP layer 203-f is then removed using HCl-based solutions (FIG. 3G). The collector metal contact pads 215 are then applied on collector layer and metal contact pads 223 are applied to the photodetector n-type layer (FIG. 3H).

The remaining step are used to fabricate the second PIN diode (layers 203-*a* to 203-*d*). The sub-collector layer 203-*e* and the second intrinsic InGaAs absorption layers 203-*d* and 203-*c* are removed by wet-etching. The etching is again controlled by selective-etching solutions (FIGS. 3I–3K). The devices are then isolated by etching the epi-layers down to the InP substrate 201 (FIG. 3L). To complete the lower stack of PIN diode, a metal contact pad 225 is evaporated or sputtered onto the p-contact layer (FIG. 3M). Finally, both p-layers (203-*h* and 203-*a*) are connected with metal interconnect 227, resulting in the structure of FIG. 2. In practice, the interconnecting metal for the PIN diodes can be carried out in the Metal 1 layer of circuit fabrication. Therefore, no additional fabrication steps are required for the fabrication of optoelectronic integration circuits.

Enhanced Performance Photodetector

The performance of the vertically integrated photodiode/HBT structure is further improved by increasing the light path through the photodiode. As shown in FIG. 3, light that is vertically directed through photodiode 220 passes through two photodiode junctions, the upper photodiode formed from the layers P1-I1-N, and the second photodiode formed by the layers N-I2-P2, and then is absorbed by substrate 201. Neglecting light reflected from the upper surface of the photodiode, the photon absorption in a photodiode can be expressed as:

$$I_{absorption} = I_{incident}(1-\exp(-\alpha d)),$$

where $I_{incident}$ is the input light energy density, $I_{absorption}$ is the absorbed photon energy density, $\alpha$ is the absorption coefficient of the photodiode, which depends on the photodiode material and wavelength of the absorbed light, and d is the interaction length of a photon traveling in absorption materials. For a p-i-n photodiode, d is the interaction length through the single photodiode junction, while for a p-i-n-i-p photodiode, d is the interaction length through the pair of photodiode junctions. The corresponding photocurrent $J_{ph}$ is proportional to quantum efficiency $\eta$ and the absorbed light energy for the ideal case, i.e.

$$J_{ph} \propto \eta \frac{I_{absorption}}{h\nu}.$$

The vertical integration of the base-collector junction as the photodetector for OEIC applications, as in structures 100 and 200, allows for the further inclusion of an optical reflector to effectively double the output of the photodetector. The use of a reflector is not limited to the structures previously described, but includes, for example, either PIN or PINIP PDs, and HBTs that may be either InP-based or GaAs-based SHBTs or DHBTs. Specifically, the insertion of a distributed Bragg reflector (DBR) between the substrate and a PIN and HBT structure is compatible with the fabrication of structures 100 and 200, as well as other structures described subsequently. A carefully designed DBR is a high-reflectivity mirror that reflects the once-absorbed light back through the photodiode. As explained below, this provides for the double pass of vertically incident light, which greatly increases the output of the photodetector.

FIG. 4 shows a schematic of a third embodiment structure 400 having a bipolar transistor 410 and a PD 420 on a DBR 430 stack, which in turn is on top of substrate 201. The layer definition of DBR 430 on substrate 201 is presented in Table II. DBR 430 forms a superlattice of alternating well layers 431 and barrier layers 433. The thickness and the number of layers 431 and 433 should vary with the change in HBT layer thickness and the required reflectivity Γ. The theoretical calculation of reflectivity of a DBR stack is well-know, and can be found, for example, in S. L. Chuang, "Physics of Optoelectronic Devices," $2^{nd}$ Ed., Wiley, New York (1995). Well layer 431 is formed from InGaAs/InP, though all III–V alloys that can be applied on substrate 201 can be used. Layers 431 and 433 contain unintentionally doped material, nominally at $10^{16}$/cm$^3$, though the actual doping level can be from $10^{13}$/cm$^3$ to $10^{18}$/cm$^3$. Well layer 431 has a nominal thickness of 200 Å and barrier layer 433 has a nominal thickness of 200 Å, and each layer has a thickness range of from 10 to 500 Å.

TABLE III

A DBR Stack Embodiment, where PD is Photodiode; UID is Unintentionally Doped; and S.I. is Semi-insulating.

| Layer Definition | | | | Doping Range, cm$^{-3}$ (nominal) | Thickness Range, Å (nominal) |
|---|---|---|---|---|---|
| Layer No. | | Materials | Type | | |
| | | photodiode or optically transparent layers | | | |
| 10–100 pairs of layers 431 and 433 (nominally 50 pairs) | 433 | DBR Superlattice Stack Barrier Layer | InGaAs/InP All III-V alloys that can be applied on a given substrate | UID | $10^{13}$–$10^{18}$ ($10^{16}$) | 10–500 (200) |
| | 431 | DBR Superlattice Well Layer | InGaAs/InP All III-V alloys that can be applied on a given substrate | UID | $10^{13}$–$10^{18}$ ($10^{16}$) | 10–500 (100) |
| | 201 | Substrate | InP metamorphic GaAs | S.I. | | |

The constituent material systems for DBR 430 include, but are not limited to, an InP/InGaAs superlattice compatible for fabrication with InP-based devices. They can be any combination of superlattice (SL) or multi-quantum wells (MQWs) among the following material systems in which lattice-matched or strained can be formed: InAlAs/InGaAs, InAlGaAs/InGaAs, InAlGaAs/InAlGaAs, InGaAsP/InGaAs, or InGaAsP/InGaAsP SLs and MQWs. Similarly, the material systems for GaAs-based and metamorphic MQWs and superlattices can be any combinations that are possible to be grown on given substrates.

Structure 400 is preferably lattice-matched to either an InP or a GaAs substrate. Alternatively, strained or metamorphic layers can be used to support structure 400. Bipolar transistor 410 includes InP-based and GaAs-based SHBTs, including but not limited to double-etch-stop ledged or non-ledged, and/or alloy-through or non-alloy-through structures in the emitter-base junction. The base-collector junction of transistor 410 is preferably a SHBT. Alternatively, transistor 410 is a DHBT that utilizes the DHBT collector region as a photon absorption layer in PD 420.

The potential of structure 400 to increase the PD output is evident from a consideration of the light converted into electrons in the structure, particularly in comparison with structure 100. Incident and reflected light is shown respectively entering and leaving photodiode 420, with a fraction Γ reflecting off of DBR 420. In general, DBR 420 has a reflectivity Γ less than 1. Comparing the photo-responsivity of a single pass PD ($R_{single-pass}$), such as structure 100, with the photo-responsivity through a double-pass PD ($R_{double-pass}$), such as structure 400 for a perfectly reflective DBR (Γ=1) gives:

$$R_{double-pass} = R_{single-pass} \cdot (1 + \exp(-\alpha d))$$

and $$R_{double-pass} \propto \frac{\eta \cdot (1 - \exp(-2\alpha d))}{h\nu}$$

The double-pass photodetector responsivity is increased by a factor of $\exp(-\alpha d)$ in comparison with a single-pass photodetectors without any compromise in device RF performance. Preferably, the top portion of photodiode 420 has an anti-reflection (AR) coating, and the reflectivity of DBR 430 should be considered in the design of the AR coating thickness. A value of Γ of from 0.7 to 1.0 will effectively increase the responsivity of photodiode 420.

A fourth embodiment of a double-pass PIN/HBT structure 400 is shown as structure 400' in FIG. 5. Structure 400' has an HBT 210 and a photodiode 220, as described previously, over a DBR 430 which is on top of substrate 201. Table III includes definitions of layers 431 and 433. Preferably, there are from 10 to 100 pairs of layers, with 50 pairs of layers being a nominal value, and with the number chosen to obtain a particular value of Γ. Structure 400' can be fabricated from a stack 600 on a substrate 201, as shown in FIG. 6. Stack 600 includes DBR stack 430 on top of substrate 201, and stack 203 on top of the DBR stack. The processing of stack 600 to form structure 400' follows the processing of stack 230 as described above with reference to FIG. 3, with the stack 430 removed along with layer 203-a.

FIG. 7 is a sectional view of a fifth embodiment semiconductor structure 400'' having a SHBT 210, a p-i-n photodiode 720 and DBR structure 430 between the SHBT/photodiode and substrate 201, with layers 800 defined in Table IV. SHBT 210 has be described previously, and is formed from layers 203-d to 203-l, as previously described. Photodiode 720 is formed from the upper layers of p-i-n-i-p photodiode 220—that is layers 203-d to 203-h. Layers 203-d to 203-l forming SHBT 210 and photodiode 720 are on top of a DBR stack 430 of 50 well/barrier layers (431 and 433, respectively).

TABLE IV

Layer Structure for a Fifth Embodiment integrated PIN/SHBT with the incorporation of DBR, where PD is Photodiode; UID is Unintentionally Doped; S.I. is Semi-insulating; + is Heavily Doped, and DBR is distributed Bragg reflector.

| Layer No. | HBT | PD | Material | Type | Doping (cm$^{-3}$) | Thickness (Å) |
|---|---|---|---|---|---|---|
| 203-l | Cap | — | InGaAs | N+ | $10^{19}$ | 1500 |
| 203-k | Emitter | — | InP | N | $10^{18}$ | 400 |
| 203-j | DESL | — | InGaAs | N | $5 \times 10^{17}$ | 50 |
| 203-i | | — | InP | N | $10^{17}$ | 300 |
| 203-h | Base | P | InGaAs | P+ | $4 \times 10^{19}$ | 500 |
| 203-g | Collector | I | InGaAs | UID | $10^{16}$ | 3000 |
| 203-f | Etch Stop | I | InP | UID | $10^{16}$ | 200 |
| 203-e | Subcollector | N | InGaAs | N+ | $10^{19}$ | 1000 |
| 203-d | — | N | InP | N+ | $5 \times 10^{18}$ | 2000 |
| 433 | DBR Superlattice Stack | Barrier | InGaAs/InP | UID | $10^{16}$ | 200 |
| 431 | (50 pairs) | Well | InGaAs/InP | UID | $10^{16}$ | 100 |
| 201 | Substrate | | Inp | S.I. | | |

FIGS. 8A–8F are sectional views of one processing embodiment for manufacturing the semiconductor structure of FIG. 7. The starting layers are shown in FIG. 8A. An emitter contact 221 is first deposited on HBT cap layer 203-l using thermal or e-gun evaporation in a vacuum system (FIG. 8B). The emitter layers are then etched to layer 203-h using a selective etching solution (FIG. 8C). The selective etching is preferred for better device uniformity control. The selective etching solutions can be found in many publications and are well-documented. Following the emitter etch, self-aligned base contact pads 213 and p-type pads 221 are applied (FIG. 8D). The base and collector etch is applied to layer 203-e (FIG. 8E). The collector metal contact pads 215 are then applied on collector layer and metal contact pads 223 are applied to the photodetector n-type layer (FIG. 8F). Finally, the sub-collector as well as the DBR layers is removed using either wet-etching or dry etching such as ICP or RIE to isolate the devices from electrically shorting and forming the structure of FIG. 7.

There are a large number of structures amenable to placing a DBR between a PD and the substrate for use in an integrated OEIC. Yet another structure 400 is shown in FIG. 9 as is a sectional view of a sixth embodiment semiconductor 400''' having a DHBT 910, a p-i-n photodiode 920 and DBR structure 430 between the SHBT/photodiode.

The invention has now been explained with regard to specific embodiments. Variations on these embodiments and other embodiments may be apparent to those of skill in the art. It is therefore intended that the invention not be limited by the discussion of specific embodiments. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. Integrated optoelectronic circuit components formed from a plurality of adjacent layers including sequential first, second and third layers on a substrate comprising:
   at least one single heterojunction bipolar transistor formed from an emitter layer and from said first, second and third layers, where said first layer forms a transistor base, said second layer forms a transistor collector, and said third layer forms a transistor subcollector, at least one p-i-n-i-p photodiode formed from said first, second and third layers, where said first layer forms a photodiode p-type layer, where said second layer forms a photodiode i-type layer, and said third layer forms a photodiode n-type layer.

2. The integrated optoelectronic circuit components of claim 1, further comprising:
a reflector formed from a plurality of layers between said at least one p-i-n-i-p photodiode and said substrate.

3. The integrated optoelectronic circuit components of claim 2, wherein said reflector is a distributed Bragg reflector.

4. The integrated optoelectronic circuit components of claim 1, wherein said p-i-n-i-p photodiode includes a metal interconnect between both of said p layers of said p-i-n-i-p photodiode.

5. The integrated optoelectronic circuit components of claim 1, wherein said substrate is an indium phosphide substrate.

6. The integrated optoelectronic circuit components of claim 5, wherein said single heterojunction bipolar transistor is an indium phosphide-based heterojunction bipolar transistor.

7. The integrated optoelectronic circuit components of claim 5, wherein the emitter material is InP, InGaAs, InAlAs, AlGaInAs, GaInAsP, or GaInAsSb.

8. The integrated optoelectronic circuit of claim 5, wherein the collector material is InP, InGaAs, InAlAs, AlGaInAs, GaInAsP, or GaInAsSb.

9. The integrated optoelectronic circuit components of claim 5, wherein the base material of said heterojunction bipolar transistor is InGaAs or an antimony-based material.

10. The integrated optoelectronic circuit components of claim 7, wherein said antimony-based material is GaAsSb.

11. The integrated optoelectronic circuit components of claim 1, wherein said substrate is a gallium arsenide substrate.

12. Integrated optoelectronic circuit components formed from a plurality of layers on a substrate comprising:
at least one p-i-n-i-p photodiode formed from said plurality of layers; and
at least one single heterojunction bipolar transistor formed from said plurality of layers
and including adjacent p, i, and n layers of said at least one p-i-n-i-p photodiode.

13. The integrated optoelectronic circuit components of claim 12, further comprising:
a reflector formed from a plurality of layers between said at least one p-i-n-i-p photodiode and said substrate.

14. The integrated optoelectronic circuit components of claim 13, wherein said reflector is a distributed Bragg reflector.

15. The integrated optoelectronic circuit components of claim 12, wherein said p-i-n-i-p photodiode includes a metal interconnect between both of said p layers of said p-i-n-i-p photodiode.

16. The integrated optoelectronic circuit components of claim 12, wherein said substrate is an indium phosphide substrate.

17. The integrated optoelectronic circuit components of claim 16, wherein said single heterojunction bipolar transistor is an indium phosphide-based heterojunction bipolar transistor.

18. The integrated optoelectronic circuit components of claim 16, wherein the emitter material is InP, InGaAs, InAlAs, AlGaInAs, GaInAsP, or GaInAsSb.

19. The integrated optoelectronic circuit of claim 16, wherein the collector material is InP, InGaAs, InAlAs, AlGaInAs, GaInAsP, or GaInAsSb.

20. The integrated optoelectronic circuit components of claim 16, wherein the base material of said heterojunction bipolar transistor is InGaAs or an antimony-based material.

21. The integrated optoelectronic circuit components of claim 18, wherein said antimony-based material is GaAsSb.

22. The integrated optoelectronic circuit components of claim 12, wherein said substrate is a gallium arsenide substrate.

23. Integrated optoelectronic circuit components formed from a plurality of layers on a substrate comprising:
a first group of said plurality of layers forming a reflector;
a second group of said plurality of layers on said first group and forming at least one bipolar transistor; and
a third group of said plurality of layers on said first group and forming at least one photodiode,
where said reflector is positioned to double-pass light through said at least one photodiode by reflecting light transmitted through said at least one photodiode back through said photodiode.

24. The integrated optoelectronic circuit components of claim 23, wherein said at least one heterojunction bipolar transistor has a base and a collector, and wherein said at least one photodiode has a junction formed by the layers that form the base and the collector of at least one heterojunction bipolar transistor.

25. The integrated optoelectronic circuit components of claim 24, wherein said at least one heterojunction bipolar transistor is a single heterojunction bipolar transistor.

26. The integrated optoelectronic circuit components of claim 23, wherein said photodiode is a p-i-n-i-p photodiode.

27. The integrated optoelectronic circuit of claim 25, wherein said at least one heterojunction bipolar transistor is an InP-based heterojunction bipolar transistor or a GaAs-based heterojunction bipolar transistor.

28. The integrated optoelectronic circuit of claim 24, wherein said at least one photodiode is a p-i-n-i-p photodiode.

29. The integrated optoelectronic circuit of claim 24, wherein said at least one photodiode is a p-i-n photodiode.

30. The integrated optoelectronic circuit of claim 23 wherein said reflector is a distributed Bragg reflector.

31. The integrated optoelectronic circuit of claim 30, wherein said at least one heterojunction bipolar transistor and said at least one photodiode InP based, and wherein said distributed Bragg reflector is an InP/InGaAs superlattice.

32. The integrated optoelectronic circuit of claim 30, wherein said at least one heterojunction bipolar transistor and said at least one photodiode InP based, and wherein said distributed Bragg reflector is an InP/InGaAs superlattice.

* * * * *